(12) United States Patent
Hokazono et al.

(10) Patent No.: US 10,116,310 B2
(45) Date of Patent: Oct. 30, 2018

(54) LEVEL SHIFT CIRCUIT, INTEGRATED CIRCUIT, AND POWER SEMICONDUCTOR MODULE

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/504,446

(22) PCT Filed: Dec. 17, 2014

(86) PCT No.: PCT/JP2014/083404
§ 371 (c)(1),
(2) Date: Feb. 16, 2017

(87) PCT Pub. No.: WO2016/098196
PCT Pub. Date: Jun. 23, 2016

(65) Prior Publication Data
US 2017/0237436 A1 Aug. 17, 2017

(51) Int. Cl.
*H03B 1/00* (2006.01)
*H03K 3/00* (2006.01)
(Continued)

(52) U.S. Cl.
CPC ....... *H03K 19/017509* (2013.01); *H03K 5/22* (2013.01); *H03K 17/063* (2013.01);
(Continued)

(58) Field of Classification Search
CPC ..... H03K 19/017509; H03K 17/08122; H03K 17/063; H03K 17/687; H03K 5/22; H03K 19/0185; H03K 2217/0063
(Continued)

(56) References Cited

U.S. PATENT DOCUMENTS 6,459,598 B1  10/2002  Yamamoto et al.
7,049,850 B2  5/2006   Shimizu
(Continued)

FOREIGN PATENT DOCUMENTS

JP  2004-328329 A  11/2004
JP  2007-201595 A  8/2007
(Continued)

OTHER PUBLICATIONS

International Search Report issued in PCT/JP2014/083404; dated Mar. 31, 2015.

*Primary Examiner* — Lincoln Donovan
*Assistant Examiner* — Metasebia Retebo
(74) *Attorney, Agent, or Firm* — Studebaker & Brackett PC

(57) ABSTRACT

A primary circuit outputs, in response to an input signal, a first signal with a first reference potential. A level shift main circuit converts the reference potential of the first signal received from the primary circuit to a second reference potential to output a second signal with the second reference potential. A secondary circuit generates an output signal with the second reference potential using the second signal. At least one rectifying element circuit is provided between the primary circuit and the secondary circuit. At least one of the primary circuit and the secondary circuit includes at least one detection circuit detecting a change in a current flowing through the rectifying element circuit to determine whether a potential corresponding to the second reference potential is (Continued)

lower than or equal to a potential corresponding to the first reference potential.

18 Claims, 16 Drawing Sheets

(51) Int. Cl.
    *H03K 19/0175*     (2006.01)
    *H03K 19/0185*     (2006.01)
    *H03K 5/22*     (2006.01)
    *H03K 17/687*     (2006.01)
    *H03K 17/06*     (2006.01)
    *H03K 17/0812*     (2006.01)

(52) U.S. Cl.
    CPC ..... *H03K 17/08122* (2013.01); *H03K 17/687* (2013.01); *H03K 19/0185* (2013.01); *H03K 2217/0063* (2013.01)

(58) Field of Classification Search
    USPC .......................................................... 327/108
    See application file for complete search history.

(56) References Cited

U.S. PATENT DOCUMENTS 8,264,057 B2     9/2012   Shimizu
2016/0118979 A1*   4/2016   Hokazono ............ H03K 17/165
                                        327/109

FOREIGN PATENT DOCUMENTS

JP       2010-263116 A    11/2010
JP       2011-015136 A    1/2011
WO     2001/059918 A1    8/2001

* cited by examiner

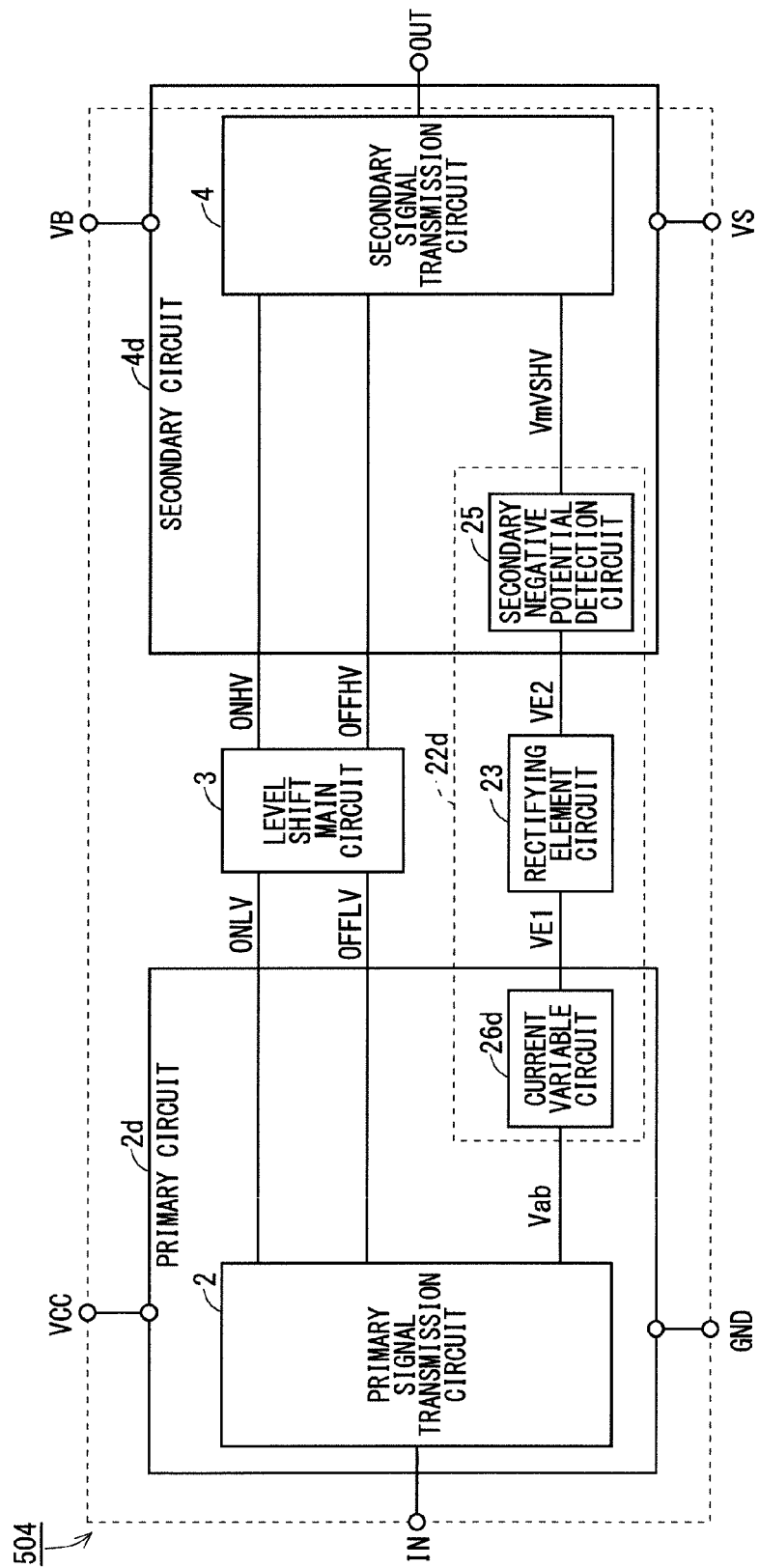
F I G. 7

F I G . 1 7
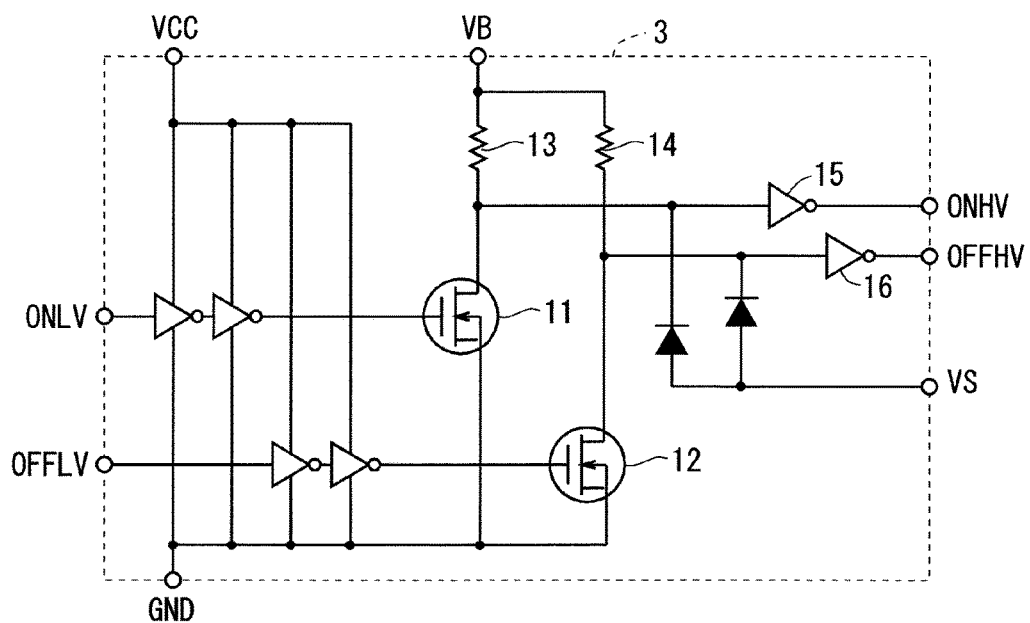

LEVEL SHIFT CIRCUIT, INTEGRATED CIRCUIT, AND POWER SEMICONDUCTOR MODULE

TECHNICAL FIELD

The present invention relates to a level shift circuit, an integrated circuit, and a power semiconductor module.

BACKGROUND ART

Inverter devices that are typical power semiconductor devices include a terminal having a reference potential of the device (also referred to as reference potential HGND), and a high-potential-side switching element and a low-potential-side switching element that are connected in series with each other between the terminal and a terminal to which a positive high voltage (also referred to as voltage HVCC) is applied. The midpoint potential between the high-potential-side switching element and the low-potential-side switching element is used as an output voltage (also referred to as voltage HVO) of the inverter device. As a result of the wiring structure, the reference potential with which the low-potential-side switching element is operated is the reference potential HGND, whereas the reference potential of the high-potential-side switching element is a reference potential VS that varies according to the voltage HVO with respect to the reference potential HGND. Thus, it is necessary to adjust, to the reference potential VS, a reference potential of a driving signal (typically, gate signal) to be input to the high-potential-side switching element.

Integrated circuits (generally called High-Voltage ICs (HVICs)) for driving the high-potential-side switching element include a level shift circuit for converting a reference potential of a signal to obtain a driving signal with the reference potential VS. The level shift circuit includes a primary circuit that receives an input signal indicating a switching timing of a high-potential-side switching element, a circuit (hereinafter referred to as level shift main circuit) that converts the reference potential of a signal which is output from the primary circuit, and a secondary circuit that outputs a driving signal for actually driving the high-potential-side switching element using the signal whose reference potential has been converted by the level shift main circuit. The secondary circuit is powered by a power supply voltage VB with the reference potential VS. Meanwhile, the primary circuit is powered by a power supply voltage VCC with a reference potential GND.

In the operations of the inverter devices handling the positive voltage HVCC, when the high-potential-side semiconductor switching element is turned OFF, a negative surge occurs at the reference potential VS of the secondary circuit due to an abrupt change in a current and an inductance of the wiring. The reduction in the reference potential VS of the secondary circuit subject to the negative surge also reduces the potential of the secondary circuit powered by the power supply voltage VB. When the potential of the secondary circuit powered by the power supply voltage VB is lower than the reference potential GND of the primary circuit, the level shift main circuit cannot transmit a signal from the primary circuit to the secondary circuit. Even without reduction in the potential to such an extent, if a difference between the potentials is insufficient, a logical circuit in the level shift main circuit does not normally operate, and the level shift main circuit may still be unable to transmit a signal.

While the signal cannot be transmitted, even when an input signal to the HVIC is switched, the output signal is not switched, thus causing a latch in the level shift circuit to malfunction. Sometimes the malfunctioning of the latch continues and interferes with a normal operation of the inverter devices, until the potential of the secondary circuit powered by the power supply voltage VB becomes sufficiently higher than the reference potential GND of the primary circuit and the input signal is again switched.

According to Japanese Unexamined Patent Application Publication No. 2010-263116 (Patent Document 1), a clamp diode is inserted between the reference potential VS and the reference potential GND to take measures against the negative surge. The anode of the clamp diode is connected to the reference potential GND, and the cathode thereof is connected to the reference potential VS. When the reference potential VS is lower than the reference potential GND, the clamp diode causes a current to flow from the reference potential GND to the reference potential VS to clamp the reference potential VS at a voltage lower by a forward voltage of the clamp diode with respect to the reference potential GND. Furthermore, according to International Publication WO01/59918 (Patent Document 2), a clamp diode and a protection circuit are arranged outside of an HVIC.

PRIOR-ART DOCUMENTS

Patent Documents

Patent Document 1: Japanese Unexamined Patent Application Publication No. 2010-263116
Patent Document 2: International Publication WO01/59918

SUMMARY OF INVENTION

Problems to be Solved by the Invention

In the technique disclosed by the Japanese Unexamined Patent Application Publication No. 2010-263116, when the variation dV/dt per unit time of the reference potential VS is larger, the reduction in the reference potential VS sometimes cannot be sufficiently suppressed. Furthermore, the technique disclosed by the International Publication WO01/59918 has a problem in constraints on packaging because of the protection circuit arranged outside of the HVIC. Furthermore, the wiring to the outside of the HVIC induces increase in the inductance and causes the negative surge to occur by itself.

The conventional techniques have not had sufficient measures against the negative surge (a positive surge as an inverse surge when a high voltage to be controlled is negative) disabling the level shift circuits to transmit a signal. Detection of a state disabling the signal transmission is effective as the measures. As described above, enabling the level shift circuits to transmit a signal requires that the reference potential of a secondary circuit is appropriate with respect to the reference potential of a primary circuit, or at least a sign (positive/negative) of the reference potential of the secondary circuit is set appropriate with respect to the reference potential of the primary circuit. Thus, detecting a relationship in reference potential between the primary circuit and the secondary circuit is effective. However, such a technique has not been sufficiently considered.

The present invention has been conceived to solve the problems, and has an object of providing a level shift circuit that can detect a relationship in reference potential between a primary circuit and a secondary circuit.

Means to Solve the Problems

A level shift circuit according to the present invention includes a primary circuit, a level shift main circuit, a secondary circuit, and at least one rectifying element circuit. The primary circuit outputs, in response to a received input signal, a first signal with a first reference potential. The level shift main circuit converts a reference potential of the first signal received from the primary circuit, from the first reference potential to a second reference potential to output a second signal with the second reference potential. The secondary circuit generates, in response to the input signal, an output signal with the second reference potential using the second signal received from the level shift main circuit. The rectifying element circuit is provided between the primary circuit and the secondary circuit. At least one of the primary circuit and the secondary circuit includes at least one detection circuit that detects a change in a current flowing through the rectifying element circuit to determine whether a potential corresponding to the second reference potential is lower than or equal to a potential corresponding to the first reference potential.

"a potential corresponding to the first reference potential" means a potential that varies according to change in the first reference potential, and may be the first reference potential itself. Furthermore, "a potential corresponding to the second reference potential" means a potential that varies according to change in the second reference potential, and may be the second reference potential itself.

Furthermore, the "rectifying element circuit" may be one element or include elements.

Effects of the Invention

According to the present invention, a rectifying element circuit is provided between a primary circuit and a secondary circuit, and a change in the current flowing through the rectifying element circuit is detected. Accordingly, it is possible to determine whether the potential corresponding to the reference potential of the secondary circuit is lower than or equal to the potential corresponding to the reference potential of the primary circuit. Accordingly, it is possible to detect a relationship in reference potential between the primary circuit and the secondary circuit.

BRIEF DESCRIPTION OF DRAWINGS

FIG. 7 is a block diagram illustrating an example of a structure of a level shift circuit according to Embodiment 4 of the present invention.

FIG. 17 is a circuit diagram illustrating a structure of a level shift main circuit included in the level shift circuit of FIG. 16.

DESCRIPTION OF EMBODIMENTS

Figure 1:
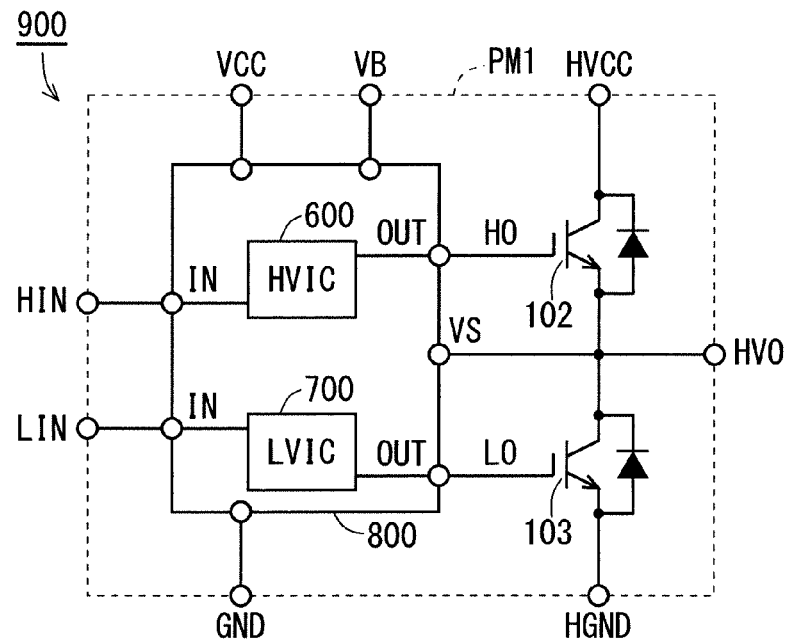
FIG. 1 is a circuit diagram illustrating an example of a structure of an inverter device as a power semiconductor module that can adopt a level shift circuit according to each of Embodiments of the present invention.

The description of Embodiments of the present invention and the preliminary description for easing the understanding thereof will be hereinafter provided with reference to the drawings. The same reference numerals are assigned to the same or equivalent portions in the drawings, and the description is not repeated.

(Power Semiconductor Module)

First, an inverter device 900 (power semiconductor module) that can adopt a level shift circuit according to each of Embodiments of the present invention will be described with reference to FIG. 1.

The inverter device 900 includes a high-potential-side switching element 102, a low-potential-side switching element 103, and a driving module 800. These structural elements are typically sealed by an insulating sealing material (not illustrated) to be integrated into one device.

The inverter device 900 includes a terminal to which a positive voltage HVCC to be controlled is applied, a terminal to which a reference potential HGND of the voltage HVCC is applied, and a terminal from which a voltage HVO is output as an inverter output. The high-potential-side switching element 102 and the low-potential-side switching element 103 are connected in series with each other, and are arranged between the terminal to which the reference potential HGND is applied and the terminal to which the voltage HVCC is applied. The terminal for outputting the voltage HVO is a terminal at a midpoint potential between the high-potential-side switching element 102 and the low-potential-side switching element 103. Each of the highpotential-side switching element 102 and the low-potential-side switching element 103 is, for example, an insulated gate bipolar transistor (IGBT) provided with a free-wheeling diode.

The driving module 800 includes an HVIC 600 and a low voltage IC (LVIC) 700. In other words, the HVIC 600 and the LVIC 700 are formed as separate chips in this example. The HVIC 600 and the LVIC 700 may be formed in one chip as a modification.

The driving module 800 includes a terminal receiving an input signal HIN as an input signal IN to the HVIC 600, and a terminal receiving an input signal LIN as an input signal IN to the LVIC 700. Furthermore, the driving module 800 includes respective terminals to which a reference potential GND and a power supply voltage VCC with respect to the reference potential GND as a reference potential are applied. Furthermore, the driving module 800 includes a terminal to which a reference potential VS that varies according to the voltage HVO of the inverter device 900 is applied, and a terminal to which a power supply voltage VB with respect to the reference potential VS as a reference potential is applied. Furthermore, the driving module 800 includes a terminal that outputs an output signal OUT from the HVIC 600 to the high-potential-side switching element 102 as a driving voltage HO, and a terminal that outputs an output signal OUT from the LVIC 700 to the low-potential-side switching element 103 as a driving voltage LO. The reference potential of the driving voltage HO is the reference potential VS, and the reference potential of the driving voltage LO is the reference potential HGND. The reference potential HGND may be the same as the reference potential GND.

Figure 2:
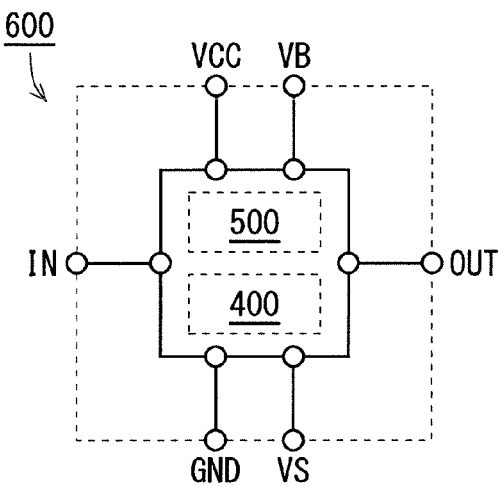
FIG. 2 is a circuit diagram illustrating an example of a structure of an HVIC included in the inverter device of FIG. 1.

With reference to FIG. 2, the HVIC 600 includes respective terminals for the input signal IN, the output signal OUT, the reference potentials GND and VS, and the power supply voltages VCC and VB. The HVIC 600 includes a level shift circuit 500 that converts a reference potential to obtain the output signal OUT with the reference potential VS from the input signal IN with the reference potential GND.

Hereinafter, a level shift circuit to be used as the level shift circuit 500 as a reference example and a level shift circuit in each of Embodiments of the present invention will be specifically described.

(Reference Example of Level Shift Circuit)

Figure 16:
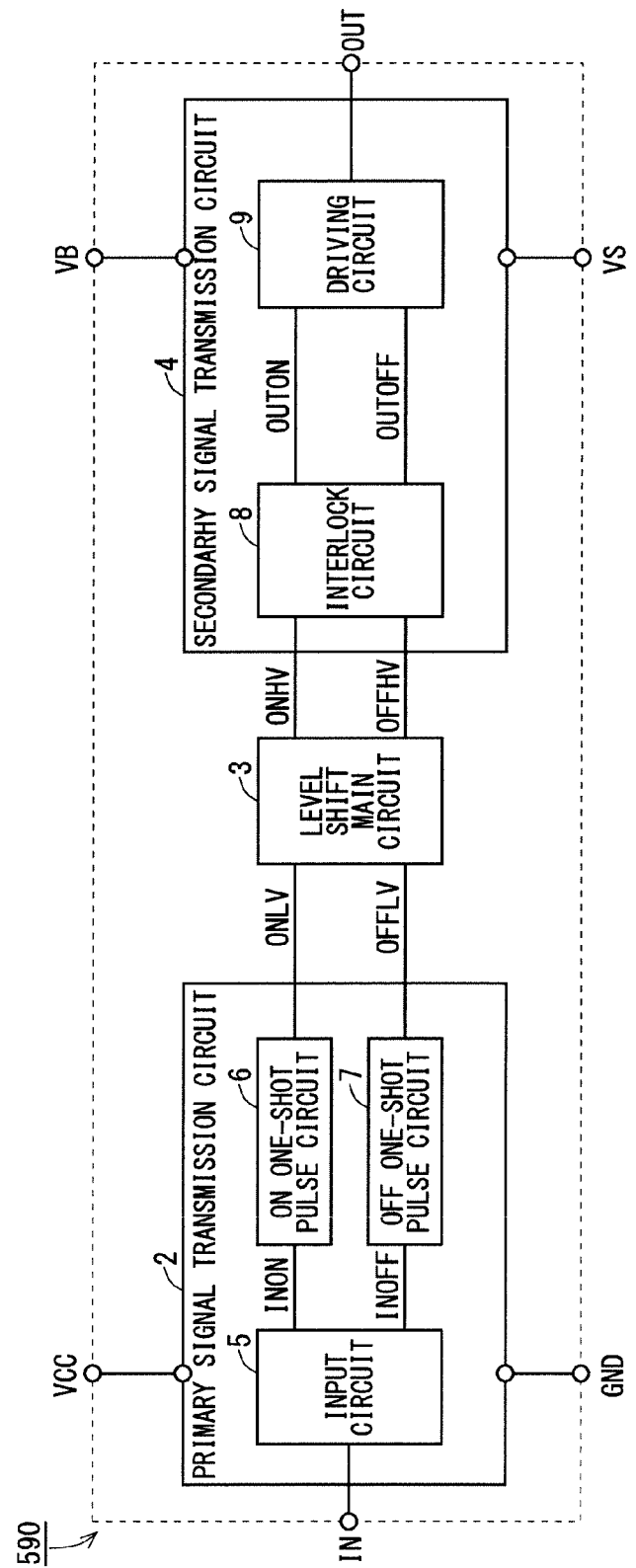
FIG. 16 is a block diagram illustrating a structure of a level shift circuit as a reference example.

With reference to FIG. 16, a level shift circuit 590 for the reference example includes a primary signal transmission circuit 2, a level shift main circuit 3, and a secondary signal transmission circuit 4. The primary signal transmission circuit 2 includes an input circuit 5, an ON one-shot pulse circuit 6, and an OFF one-shot pulse circuit 7. The secondary signal transmission circuit 4 includes an interlock circuit 8 and a driving circuit 9. The primary signal transmission circuit 2 is a circuit that generates pulse signals ONLV and OFFLV from the input signal IN. The level shift main circuit 3 is a circuit that transmits the pulse signals ONLV and OFFLV to the secondary signal transmission circuit 4 as pulse signals ONHV and OFFHV, respectively. The secondary signal transmission circuit 4 is a circuit that generates an output signal OUT.

The primary signal transmission circuit 2 is driven by a power supply voltage VCC with a reference potential GND. The primary signal transmission circuit 2 is a circuit that generates the pulse signals ONLV and OFFLV in synchronization with the input signal IN. The pulse signal ONLV rises in synchronization with a rising edge of the input signal IN, and the pulse signal OFFLV rises in synchronization with a falling edge of the input signal IN.

The input circuit 5 is a circuit that generates signals INON and INOFF in synchronization with the input signal IN. The signal INON is a signal synchronized with the input signal IN, and the signal INOFF is a signal synchronized with a signal obtained by inverting the input signal IN. In other words, the signal INON represents an ON state and the signal INOFF represents an OFF state, as information on the input signal IN that is either in the ON state or in the OFF state. When both of the signals INON and INOFF accurately reflect the state of the input signal IN, the signal INON corresponds to an inverted signal of the signal INOFF, and the signal INOFF corresponds to an inverted signal of the signal INON.

The ON one-shot pulse circuit 6 is a circuit that generates the pulse signal ONLV in synchronization with the signal INON. The pulse signal ONLV is a signal that rises in synchronization with the rising edge of the signal INON. The OFF one-shot pulse circuit 7 is a circuit that generates the pulse signal OFFLV in synchronization with the signal INOFF. The pulse signal OFFLV is a signal that rises in synchronization with the rising edge of the signal INOFF.

The level shift main circuit 3 is a circuit that generates the pulse signals ONHV and OFFHV in synchronization with the signals ONLV and OFFLV, respectively, with respect to the reference potential VS different from the reference potential GND.

The secondary signal transmission circuit 4 is driven by a power supply voltage VB with the reference potential VS. The secondary signal transmission circuit 4 is a circuit that generates the output signal OUT in synchronization with the pulse signals ONHV and OFFHV. The output signal OUT rises in synchronization with a rising edge of the pulse signal ONHV, and falls in synchronization with a rising edge of the pulse signal OFFHV.

The interlock circuit 8 is a circuit that generates pulse signals OUTON and OUTOFF in synchronization with the pulse signals ONHV and OFFHV, respectively. Specifically, the pulse signal OUTON is switched between a high level (H) and a low level (L) to correspond to the pulse signal ONHV that is in H or L. Similarly, the pulse signal OUTOFF is switched between H and L to correspond to the pulse signal OFFHV that is in H or L. However, when both of the pulse signals ONHV and OFFHV are in H, both of the pulse signals OUTON and OUTOFF are switched to L.

The driving circuit 9 is a circuit that generates the output signal OUT with the reference potential VS in synchronization with the pulse signals OUTON and OUTOFF. Specifically, the output signal OUT is a signal that rises in synchronization with a rising edge of the pulse signal OUTON and falls in synchronization with a rising edge of the pulse signal OUTOFF.

With reference to FIG. 17, the level shift main circuit 3 includes high withstand voltage n-channel metal oxide semiconductor field effect transistors (nMOSFETs) 11 and 12, and resistors 13 and 14. Switching between ON and OFF of the high withstand voltage nMOSFETs 11 and 12 according to the pulse signals ONLV and OFFLV, respectively, causes the primary signal transmission circuit 2 to transmit a signal to the secondary signal transmission circuit 4.

When the high withstand voltage nMOSFETs 11 and 12 are OFF, no current flows through the high withstand voltage nMOSFETs 11 and 12 and the resistors 13 and 14. Thus, a midpoint potential between the resistor 13 and the high withstand voltage nMOSFET 11 is pulled up by the resistor 13. Similarly, a midpoint potential between the resistor 14 and the high withstand voltage nMOSFET 12 is pulled up by the resistor 14. As a result, each of input voltage signals to inverters 15 and 16 is in H. Thus, the pulse signals ONHV and OFFHV to be output from the inverters 15 and 16, respectively, are in L.

When the high withstand voltage nMOSFETs 11 and 12 are ON, currents flow from the power supply voltage VB to the reference potential GND through the high withstand voltage nMOSFETs 11 and 12 and the resistors 13 and 14, respectively. Thus, each of the midpoint potentials between the resistor 13 and the high withstand voltage nMOSFET 11 and between the resistor 14 and the high withstand voltage nMOSFET 12 is reduced. As a result, each of input voltage signals to the inverters 15 and 16 is in L. Thus, the pulse signals ONHV and OFFHV to be output from the inverters 15 and 16, respectively, are in H.

Consequently, currents need to be supplied to the resistors 13 and 14 so that the level shift main circuit 3 transmits signals based on the pulse signals ONLV and OFFLV. Thus, the power supply voltage VB has to be higher than the reference potential GND. When the power supply voltage VB is lower than the reference potential GND, no current flows from the power supply voltage VB to the reference potential GND, thus disabling the signal transmission. Such a state may occur by the negative surge occurring at the reference potential VS in the operations of the inverter device 900 (FIG. 1) as described above.

Next, each of Embodiments of the present invention will be described by appropriately omitting the same or equivalent description on the level shift circuit 590 (FIG. 16).

Embodiment 1

Figure 3:
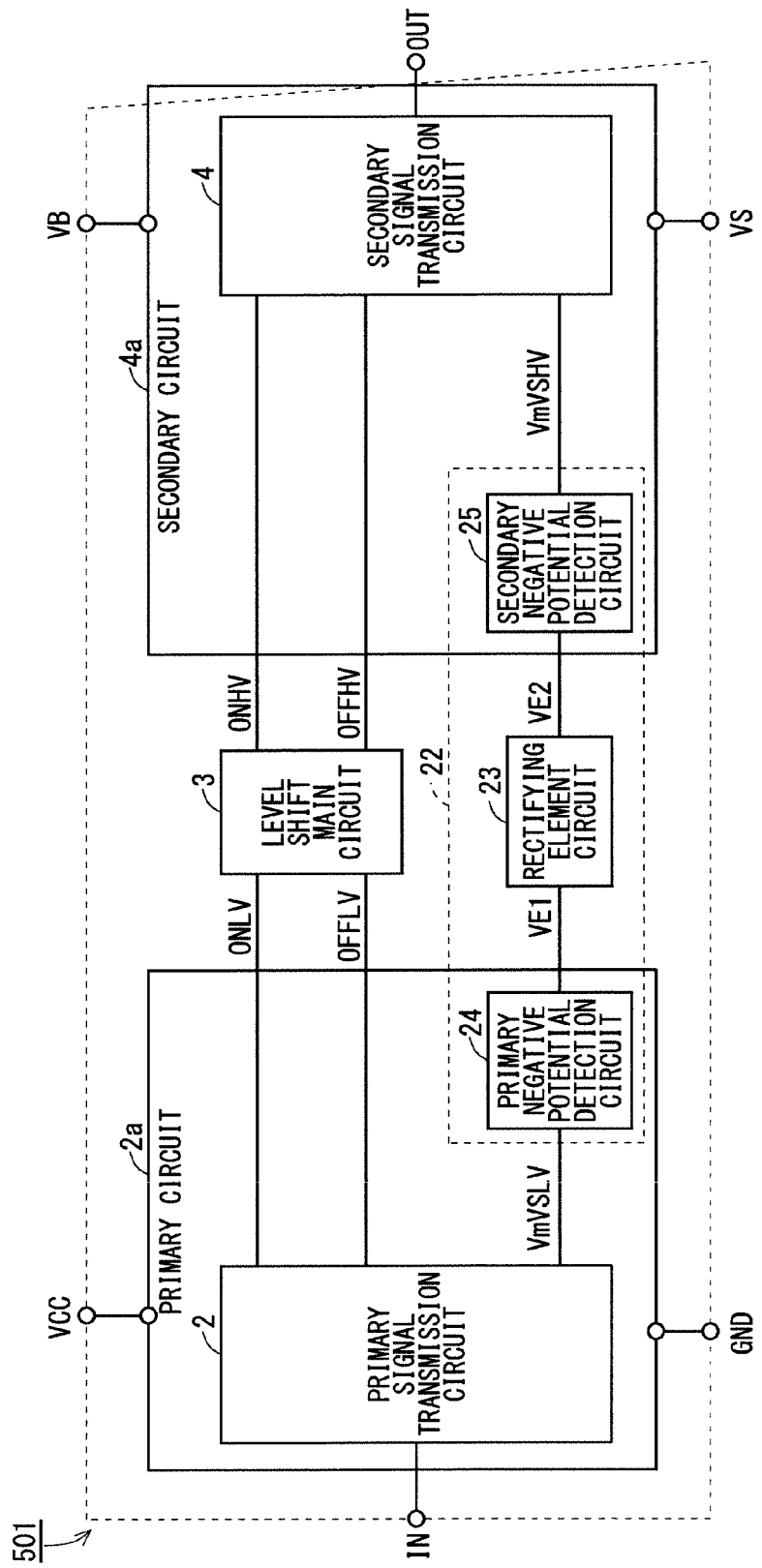
FIG. 3 is a block diagram illustrating an example of a structure of a level shift circuit according to Embodiment 1 of the present invention.

With reference to FIG. 3, an outline of a level shift circuit 501 will be first described. The level shift circuit 501 includes a primary circuit 2a, a level shift main circuit 3, a secondary circuit 4a, and a rectifying element circuit 23.

The primary circuit 2a is driven by a power supply voltage VCC (first power supply voltage) with a reference potential GND (first reference potential), and receives an input signal IN. The secondary circuit 4a is driven by a power supply voltage VB (second power supply voltage) with a reference potential VS (second reference potential), and generates an output signal OUT. This holds true for the other Embodiments.

The primary circuit 2a is a circuit that includes the primary signal transmission circuit 2 (FIG. 16) and outputs, in response to the received input signal IN, pulse signals ONLV and OFFLV (first signals) with the reference potential GND. The level shift main circuit 3 is a circuit that converts the reference potential of the pulse signals ONLV and OFFLV received from the primary signal transmission circuit 2 from the reference potential GND to the reference potential VS to output pulse signals ONHV and OFFHV (second signals) with the reference potential VS, similarly as the reference example (FIG. 16). The secondary circuit is a circuit that includes the secondary signal transmission circuit 4 (FIG. 16) and generates, in response to the input signal IN, the output signal OUT with the reference potential VS, using the pulse signals ONHV and OFFHV received from the level shift main circuit 3.

The rectifying element circuit 23 includes an element having rectifying properties, and joins the primary circuit 2a and the secondary circuit 4a. Accordingly, the rectifying element circuit 23 has rectifying properties that interfere with a current flowing, with respect to a current flowing in one direction, in the other direction between the primary circuit 2a and the secondary circuit 4a. When the positive voltage HVCC is handled with respect to the reference potential HGND as the inverter device 900 (FIG. 1), that is, when the reference potential VS higher than the reference potential GND is used in a normal state with no inverse surge caused by an operation of the inverter device 900, it is preferred that the rectifying direction allows a current to flow from the primary circuit 2a to the secondary circuit 4a, that is, interferes with a current flowing from the secondary circuit 4a to the primary circuit 2a. When a negative voltage HVCC is handled with respect to the reference potential HGND, the rectifying direction is opposite to that of the positive voltage HVCC.

At least one of the primary circuit 2a and the secondary circuit 4a includes a detection circuit that detects a change in the current flowing through the rectifying element circuit 23 to determine whether the reference potential VS as a reference potential of the secondary circuit 4a is lower than or equal to the reference potential GND as a reference potential of the primary circuit 2a. In the structure of FIG. 3, a primary negative potential detection circuit 24 included in the primary circuit 2a and a secondary negative potential detection circuit 25 included in the secondary circuit 4a are provided as the detection circuits. The rectifying element circuit 23, the primary negative potential detection circuit 24, and the secondary negative potential detection circuit 25 compose a negative potential detector 22. One of the primary negative potential detection circuit 24 and the secondary negative potential detection circuit 25 may be omitted.

The negative potential detector 22 is a circuit that determines that a potential VE2 corresponding to the reference potential VS of the secondary circuit 4a is a potential lower than or equal to a potential VE1 corresponding to the reference potential GND of the primary circuit 2a (hereinafter referred to as "negative potential" for convenience) to generate at least one of negative potential detection signals VmVSLV and VmVSHV, which will be described later with reference to FIG. 4 in detail. The rectifying element circuit 23 is inserted between the primary circuit 2a and the secondary circuit 4a, and is connected to at least one of the primary negative potential detection circuit 24 and the secondary negative potential detection circuit 25. Although one of the primary negative potential detection circuit 24 and the secondary negative potential detection circuit 25 is a circuit that detects a current flowing through the rectifying element circuit 23, when the negative potential detector 22 includes both of the primary negative potential detection circuit 24 and the secondary negative potential detection circuit 25, one of the primary negative potential detection circuit 24 and the secondary negative potential detection circuit 25 can serve as a circuit that controls the current flowing through the rectifying element circuit 23. Although the current flowing through the rectifying element circuit 23 may be detected in any method, for example, by converting a current into a voltage, at least a change in the current flowing through the rectifying element circuit 23 between when the potential VE2 is a negative potential and when the potential VE2 is a positive potential (a potential higher than or equal to the potential VE1) is detected.

According to Embodiment 1, the primary negative potential detection circuit 24 or the secondary negative potential detection circuit 25 detects a change in the current flowing through the rectifying element circuit 23 between the times when the potential VE2 is negative and positive, so that it is possible to determine that the potential VE2 is negative and generate at least one of the negative potential detection signals VmVSLV and VmVSHV. For example, when the primary circuit 2a detects a negative potential, the primary negative potential detection circuit 24 detects the current supplied to the rectifying element circuit 23 to generate the negative potential detection signal VmVSLV. When the secondary circuit 4a detects a negative potential, the secondary negative potential detection circuit 25 detects the current supplied to the rectifying element circuit 23 to generate the negative potential detection signal VmVSHV. Here, the other negative potential detection circuit may control a value of the current flowing through the rectifying element circuit 23.

The generated negative potential detection signals VmVSLV and VmVSHV may be processed inside the level shift circuit 501 as illustrated in FIG. 3, or output to an external device through an external terminal (not illustrated). For example, it is possible that a signal that has detected a negative potential is output to a microcomputer and the microcomputer controls the level shift circuit 501.

Particularly, the negative potential detector 22 (FIG. 3) that is placed between the potentials GND and VS as a negative potential detector 22z (FIG. 4) can directly detect a relationship between the reference potentials GND and VS. This holds true for the negative potential detectors in the other Embodiments.

FIG. 3 illustrates an embodiment in which the level shift circuit 501 includes the rectifying element circuit 23. Accordingly, the constraints on packaging can be eased, and further the influence of inductance of the wiring can be reduced. However, when these problems are not particularly significant, a rectifying element circuit may be provided outside of the level shift circuit. This holds true for the other Embodiments.

Further with reference to FIG. 4, the negative potential detector 22z will be described as a specific example of the negative potential detector 22.

The negative potential detector 22z includes the secondary negative potential detection circuit 25 out of the primary negative potential detection circuit 24 and the secondary negative potential detection circuit 25. The negative potential detector 22z is a circuit that generates the secondary negative potential detection signal VmVSHV that is in H when the potential VE2 is negative. In this example, a high withstand voltage diode 23z is used as the rectifying element circuit 23. In the high withstand voltage diode 23z, the anode potential is set to a potential VE1, and the cathode potential is set to the potential VE2. The anode of the high withstand voltage diode 23z is connected to a reference potential GND, and the cathode thereof is connected to a reference potential VS through a resistor 31. When the potential VE2 is higher than the potential VE1, the high withstand voltage diode 23z is reverse-biased. Thus, no current flows between the primary circuit 2a and the secondary circuit 4a, and the resistor 31 pulls down the potential VE2 of the high withstand voltage diode 23z to the reference potential VS. In other words, the potential VE2 becomes equal to the reference potential VS. Here, since an nMOSFET 32 is in an OFF state, the resistor 33 pulls up a drain potential of the nMOSFET 32 to the power supply voltage VB, and an inverter 34 outputs the signal VmVSHV that is in L. When reduction in the reference potential VS causes the potential VE2 to be lower than or equal to the potential VE1, the high withstand voltage diode 23z is forward-biased, thus resulting in a current flowing from the reference potential GND to the reference potential VS. Since the cathode potential VE2 of the high withstand voltage diode 23z becomes a potential higher than the reference potential VS by a voltage drop of the resistor 31, the nMOSFET 32 whose source potential is the reference potential VS is turned ON and the inverter 34 outputs the signal VmVSHV that is in H. With the circuit operation, it is possible to determine the potential VE2 corresponding to the reference potential VS to be negative. Although not illustrated, the negative potential detector 22z may include a protection element that prevents an excessive high voltage from being applied between a gate and a source of the nMOSFET 32. The negative potential detector 22z may include, for example, a diode whose anode is connected to the gate of the nMOSFET 32 and whose cathode is connected to the power supply voltage VB, or a Zener diode whose anode is connected to the reference potential VS and whose cathode is connected to the gate of the nMOSFET 32.

Figure 4:
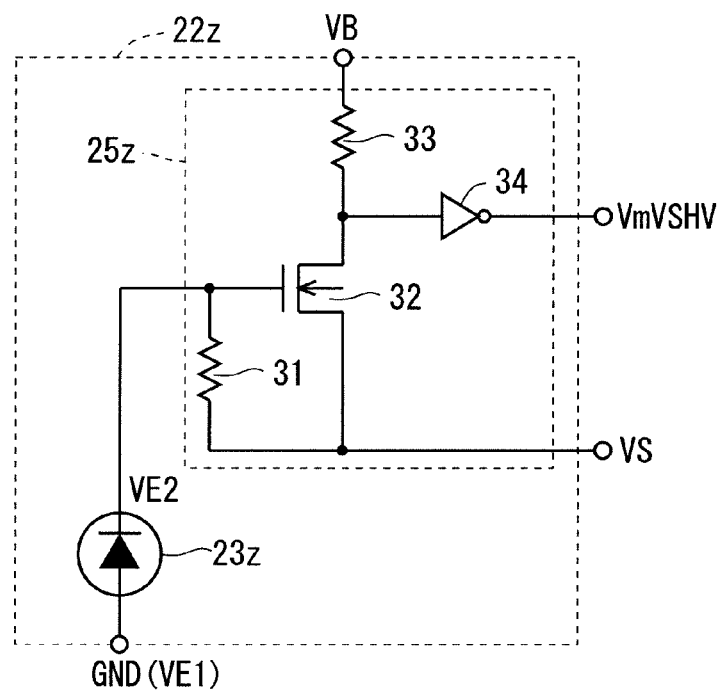
FIG. 4 is a circuit diagram illustrating an example of a structure of a negative potential detection circuit included in the level shift circuit of FIG. 3.

Although FIG. 4 exemplifies that the high withstand voltage diode 23z is used as the rectifying element circuit 23, the rectifying element circuit 23 may include elements or have a structure in which, for example, a diode is connected in series with a high withstand voltage resistor for compensating for a withstand voltage of the diode. Furthermore, the rectifying element circuit 23 may be a semiconductor element other than diodes, for example, a high withstand voltage nMOSFET. Here, "high withstand voltage" means a withstand voltage enough to withstand a voltage handled by the level shift circuit 501, for example, a voltage approximately higher than or equal to 100 V.

Although in FIG. 4, the anode of the high withstand voltage diode 23z is connected to the reference potential GND without the primary negative potential detection circuit 24 (FIG. 3) interposed therebetween, the current flowing though the high withstand voltage diode 23z may be controlled by, for example, inserting a constant current source at the position of the primary negative potential detection circuit 24.

The circuit of the negative potential detector 22z (FIG. 4) is a mere example of the circuit of the negative potential detector 22 (FIG. 3), and may be another.

Embodiment 2

As described above in Embodiment 1, at least one of the negative potential detection signals VmVSLV and VmVSHV each indicating that the potential VE2 corresponding to the reference potential VS is determined to be negative is generated. In Embodiment 2, a signal indicating at least one of an ON state and an OFF state of an input signal IN is generated using the detection signal VmVSLV.

Figure 5:
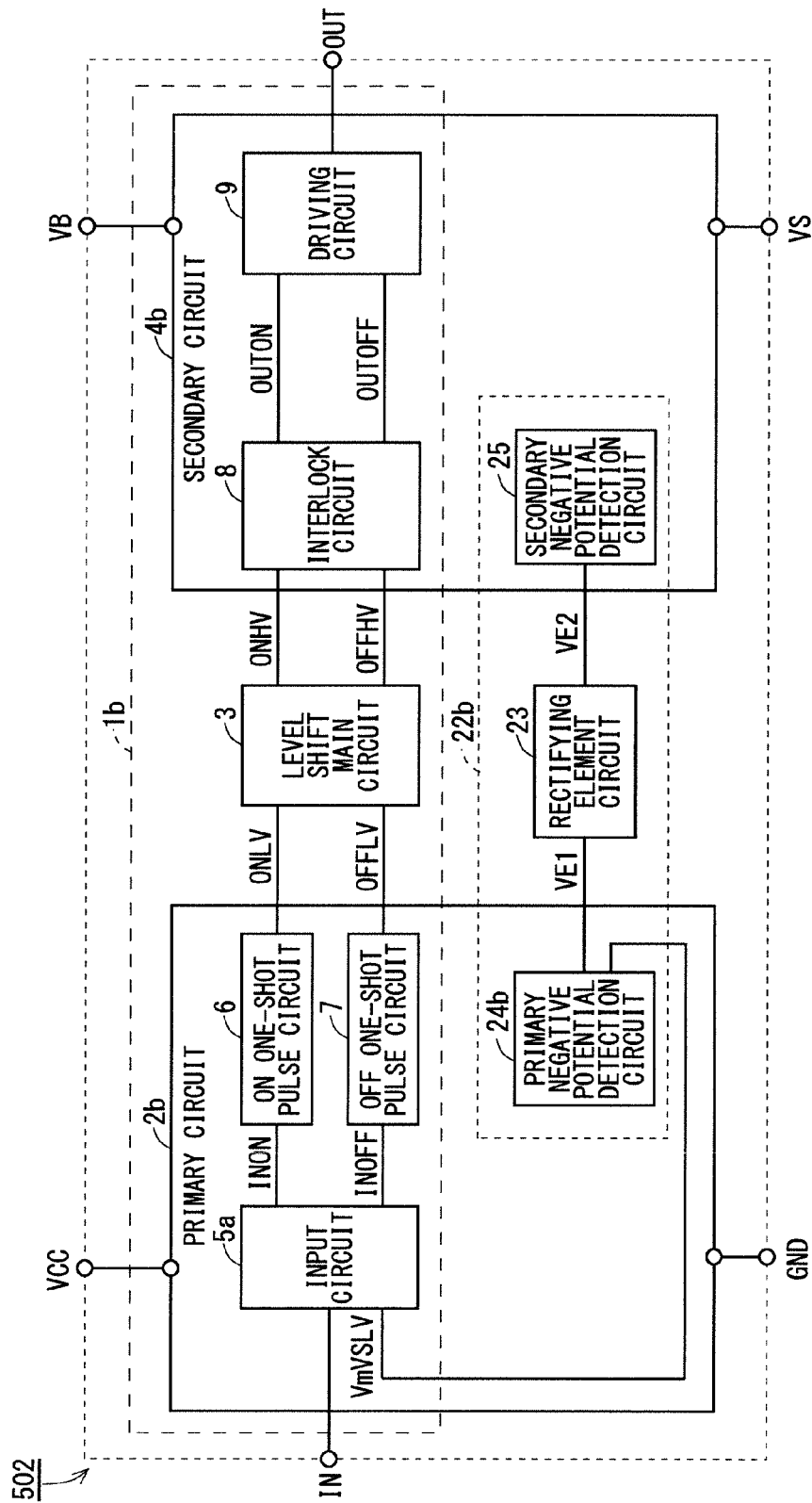
FIG. 5 is a block diagram illustrating an example of a structure of a level shift circuit according to Embodiment 2 of the present invention.

With reference to FIG. 5, a negative potential detector 22b of a level shift circuit 502 includes a primary negative potential detection circuit 24b that generates the negative potential detection signal VmVSLV indicating that the potential VE2 corresponding to the reference potential VS is negative. An input circuit 5a generates signals INON and INOFF in synchronization with the input signal IN, as the input circuit 5 (FIG. 16). In other words, the input circuit 5a generates the signals INON and INOFF corresponding to the ON state and the OFF state of the input signal IN, respectively. At least one of the signals INON and INOFF is generated also by using the negative potential detection signal VmVSLV. In other words, at least one of the signals INON and INOFF is generated also by using at least one signal different from the input signal IN.

According to Embodiment 2, upon input of the negative potential detection signal VmVSLV to the input circuit 5a, at least one of the signals INON and INOFF can be generated also by using the negative potential detection signal VmVSLV. The negative potential detection signal VmVSLV is generated, for example, when the potential VE2 is negative and the level shift main circuit 3 cannot transmit a signal. The negative potential detection signal VmVSLV may be a signal to be inverted when the level shift main circuit 3 can transmit a signal with increase in the potential VE2. For example, the signal is in H when the level shift main circuit 3 cannot transmit a signal, and is in L when the level shift main circuit 3 can transmit a signal (this holds true for the other Embodiments with the same structure). Here, the input circuit 5a is a circuit that generates the signal INON when the input signal IN=H is satisfied and the negative potential detection signal VmVSLV is inverted, or that generates the signal INOFF when the input signal IN=L is satisfied and the negative potential detection signal VmVSLV is inverted. Accordingly, at least one of the signals INON and INOFF synchronized with an input signal can be generated when the potential VE2 increases and the level shift main circuit 3 becomes able to transmit a signal. Thus, at least one of the states of the input signal can be transmitted to a secondary circuit 4b through the level shift main circuit 3. Accordingly, a state of the input signal IN can be transmitted to the secondary circuit 4b without waiting for switching of the input signal IN, after the potential VE2 is determined to be negative and when the level shift main circuit 3 becomes able to transmit a signal. For example, in the event of a latch malfunction when the potential VE2 is negative, the malfunction period can be shortened.

Although FIG. 5 exemplifies that the primary negative potential detection circuit 24b generates the negative potential detection signal VmVSLV, the negative potential detection signal VmVSLV generated by the secondary negative potential detection circuit 25 included in the secondary circuit 4b may be transmitted to a primary circuit 2b. Furthermore, the type of the negative potential detection signal VmVSLV to be input to the input circuit 5a may be any, for example, a pulse signal. This holds true for the other Embodiments with the same structure.

Embodiment 3

As described above in Embodiment 1 or 2, at least one of the negative potential detection signals VmVSLV and VmVSHV each indicating that the potential VE2 corresponding to the reference potential VS is determined to be negative is generated. In Embodiment 3, at least one of states of an output signal OUT is transmitted from a secondary circuit to a primary circuit using this detection signal. With the signal, a signal indicating at least one of states of an input signal IN can be generated in consideration of the state of the output signal OUT.

Figure 6:
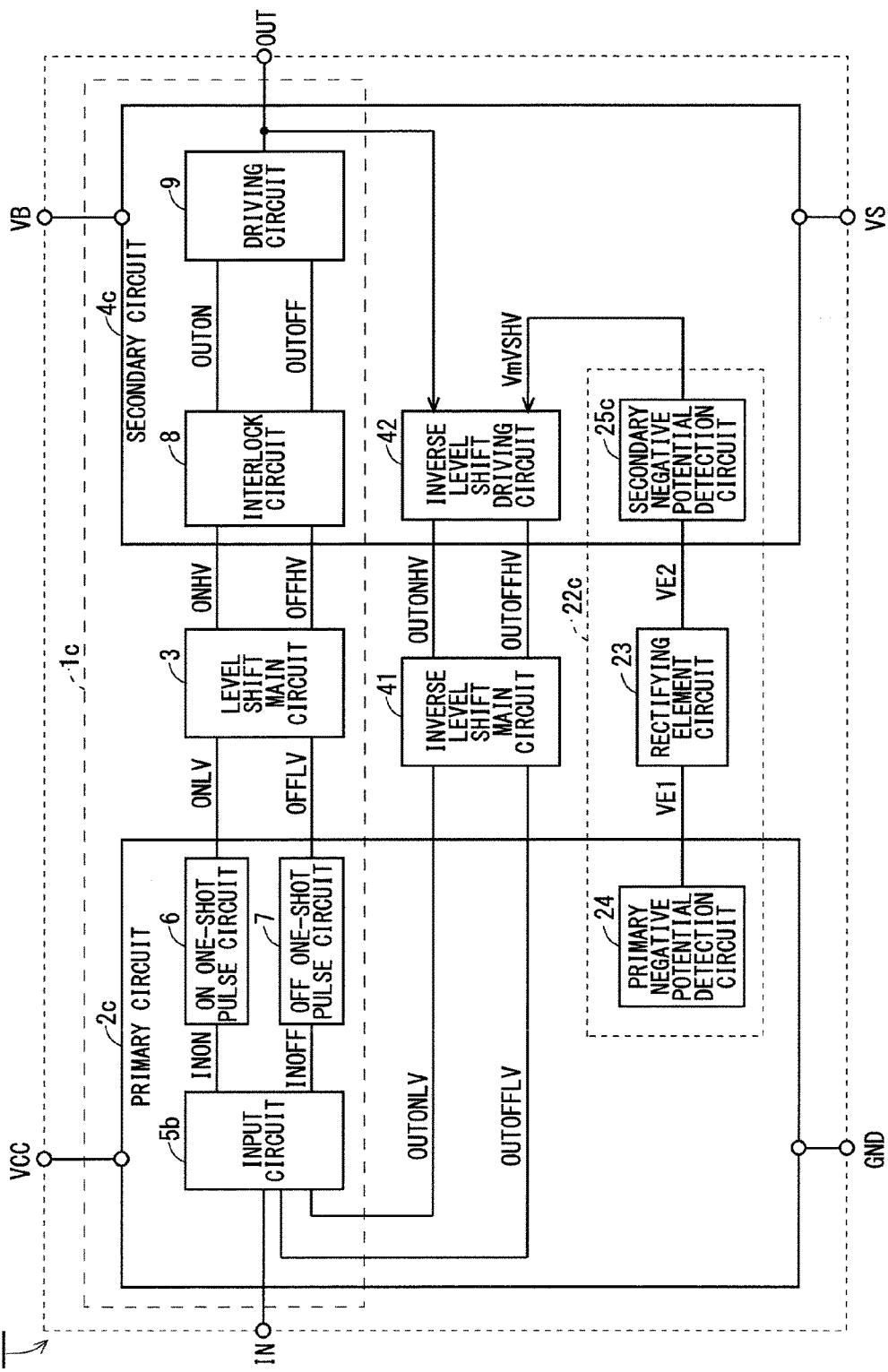
FIG. 6 is a block diagram illustrating an example of a structure of a level shift circuit according to Embodiment 3 of the present invention.

With reference to FIG. 6, a level shift circuit 503 includes an inverse level shift driving circuit 42 and an inverse level shift main circuit 41 to transmit at least one of the states of the output signal OUT from a secondary circuit 4c to a primary circuit 2c.

The inverse level shift driving circuit 42 is a circuit that generates a signal indicating at least one of an ON state and an OFF state of the output signal OUT. Specifically, the inverse level shift driving circuit 42 generates at least one of signals OUTONHV and OUTOFFHV by using a negative potential detection signal VmVSHV from a secondary negative potential detection circuit 25c. In FIG. 6, the signal OUTONHV indicates that the output signal OUT is in H, and the signal OUTOFFHV indicates that the output signal OUT is in L.

The inverse level shift main circuit 41 is a circuit that level-shifts a signal from the signal with the reference potential VS to the signal with the reference potential GND. The inverse level shift main circuit 41 level-shifts at least one of the secondary signals OUTONHV and OUTOFFHV to generate a corresponding one of primary signals OUTONLV and OUTOFFLV.

An input circuit 5b generates signals INON and INOFF in synchronization with the input signal IN. Furthermore, the input circuit 5b is a circuit that generates at least one of the signals INON and INOFF also by using a corresponding one of the primary signals OUTONLV and OUTOFFLV transmitted from the inverse level shift main circuit 41. In other words, the input circuit 5b is a circuit that generates at least one of the signals INON and INOFF also by using at least one signal different from the input signal IN.

According to Embodiment 3, a control in consideration of a state of the output signal OUT can be performed by transmitting, to the primary circuit 2c, the state of the output signal OUT when the potential VE2 is negative. The negative potential detection signal VmVSHV is generated, for example, when the potential VE2 is negative and the level shift main circuit 3 and the inverse level shift main circuit 41 cannot transmit a signal. The negative potential detection signal VmVSHV may be a signal to be inverted when the level shift main circuit 3 and the inverse level shift main circuit 41 become able to transmit a signal with increase in the potential VE2. The state of the output signal OUT when the signal VmVSHV is inverted can be transmitted to the primary circuit 2c by generating at least one of the signals OUTONHV and OUTOFFHV using the inversion of the signal as a trigger. Furthermore, at least one of the signals OUTONLV and OUTOFFLV transmitted to the primary circuit 2c is input to the input circuit 5b, so that at least one of the signals INON and INOFF can be generated and transmitted to the secondary circuit 4c.

Furthermore, at least one of the signals INON and INOFF can be generated when the input signal IN differs from the output signal OUT in state, by setting the input circuit 5b to a circuit that generates the signal INON using the signal OUTOFFLV when the input signal IN=H is satisfied and that generates the signal INOFF using the signal OUTONLV when the input signal IN=L is satisfied. Accordingly, in the event of a latch malfunction when the potential VE2 is negative, the malfunction period can be shortened. Since unnecessary operations of the level shift main circuit 3 can be reduced when the input signal IN is identical to the output signal OUT in state, that is, when a latch does not malfunction, the current to be consumed and the heat to be generated can be reduced.

Although the output signal OUT itself is input to the inverse level shift driving circuit 42 as a signal indicating a state of the output signal OUT in FIG. 6, each of the signals OUTON and OUTOFF can be used as the signal indicating the state of the output signal OUT. This holds true for the other Embodiments with the same structure.

Embodiment 4

In Embodiment 4, the value of the current flowing through the rectifying element circuit 23 described in Embodiment 1 is made variable according to any signal in a primary circuit or a secondary circuit. Accordingly, when the potential VE2 is negative, at least one of states of the signal can be transmitted between a primary circuit and a secondary circuit.

With reference to FIG. 7, a negative potential detector 22d of a level shift circuit 504 includes the rectifying element circuit 23, the secondary negative potential detection circuit 25, and a current variable circuit 26d. The current variable circuit 26d is a circuit that supplies the rectifying element circuit 23 with a current variable according to any given signal Vab. This circuit is any as long as it can supply the rectifying element circuit 23 with a current of a different value, according to the signal Vab in a different state. Furthermore, the secondary negative potential detection circuit 25 is any as long as it can detect a change in the current supplied to the rectifying element circuit 23 according to the signal Vab in a different state.

According to Embodiment 4, the current variable circuit 26d supplies the rectifying element circuit 23 with the current variable according to a state of the signal Vab, and the secondary negative potential detection circuit 25 detects a change in the current when the potential VE2 is negative. Accordingly, while the potential VE2 is negative, at least one of states of the signal Vab can be transmitted from a primary circuit 2d to a secondary circuit 4d. In other words, even when the potential VE2 is negative and the level shift main circuit 3 cannot transmit a signal, the signal can be transmitted from the primary circuit 2d to the secondary circuit 4d through the rectifying element circuit 23.

Although the secondary negative potential detection circuit 25 and the current variable circuit 26d included in the primary circuit 2d are used in the structure above, they may be arranged in reverse. In other words, the primary negative potential detection circuit 24 (FIG. 3) and the current variable circuit 26d included in the secondary circuit 4d may be used. Here, the signal can be similarly transmitted from the secondary circuit 4d to the primary circuit 2d.

Figure 8:
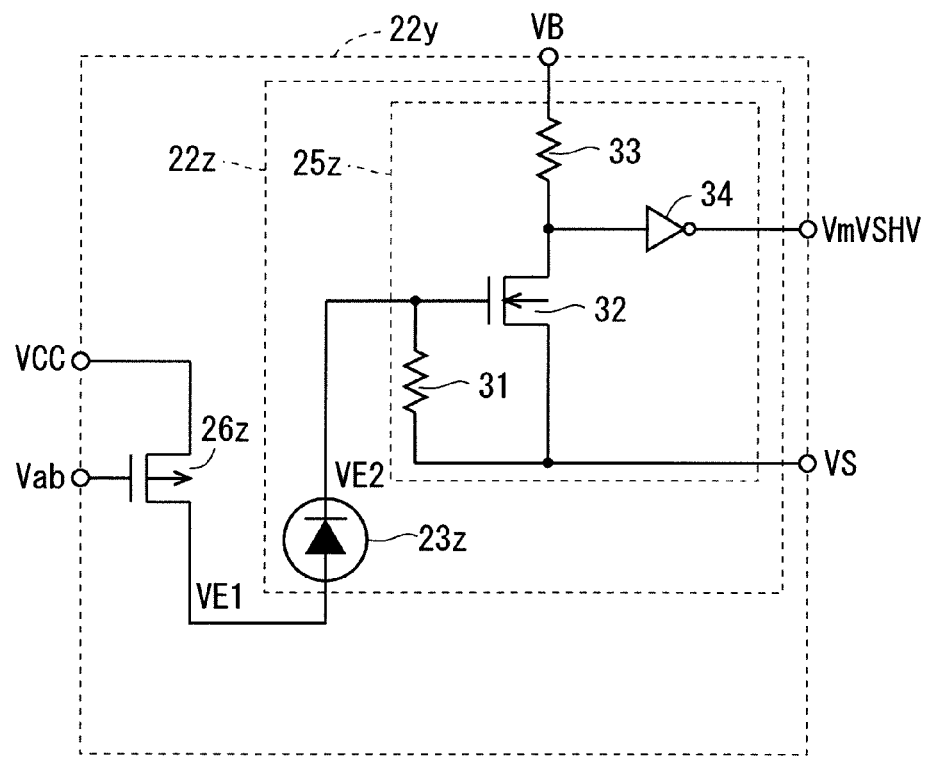
FIG. 8 is a circuit diagram illustrating an example of a structure of a negative potential detection circuit included in the level shift circuit of FIG. 7.

Further with reference to FIG. 8, a negative potential detector 22y as a specific example of the negative potential detector 22d (FIG. 7) will be hereinafter described.

The negative potential detector 22y is a circuit that sets a detection signal VmVSHV to H when the potential VE2 is lower than or equal to the potential VE1 and the signal Vab=L is satisfied. In the negative potential detector 22y, the negative potential detector 22z exemplified in Embodiment 1 is connected to, as the current variable circuit 26d (FIG. 7), a pMOSFET 26z whose source potential is a potential of a power supply voltage VCC (may be an internal power supply voltage VREG generated by the primary circuit) with respect to the reference potential GND. The signal Vab is input to the gate of the pMOSFET 26z.

In this example, when the potential VE2 is lower than or equal to the potential VE1, a high withstand voltage diode 23z is forward-biased, thus enabling a current to flow from the primary circuit 2d to the secondary circuit 4d. Here, at least one of the states of the signal Vab can be transmitted from the primary circuit 2d to the secondary circuit 4d, by varying the current supplied to the high withstand voltage diode 23z using any signal Vab to be input to the gate of the pMOSFET 26z.

When the potential VE2 is lower than or equal to the potential VE1 and the signal Vab=L is satisfied, the high withstand voltage diode 23z is forward-biased and the pMOSFET 26z is in an ON state. Thus, a current flows from the primary circuit 2d to the secondary circuit 4d, and therefore a secondary negative potential detection circuit 25z determines that the detection signal VmVSHV=H is satisfied. When the potential VE2 is lower than or equal to the potential VE1 and the signal Vab=H is satisfied, the high withstand voltage diode 23z is forward-biased. However, since the pMOSFET 26z is in an OFF state, a current is not supplied from the primary circuit 2d to the secondary circuit 4d. Thus, the secondary negative potential detection circuit 25z determines that the detection signal VmVSHV=L is satisfied. When the potential VE2 is higher than or equal to the potential VE1, the high withstand voltage diode 23z is reverse-biased. Thus, the detection signal VmVSHV=L is satisfied irrespective of the state of the signal Vab. The circuit operations in the example of FIG. 8 show that the detection signal VmVSHV=H is satisfied only when the potential VE2 is lower than or equal to the potential VE1 and the signal Vab=L is satisfied. Thus, when the potential VE2 is negative, a state indicating the signal Vab=L can be transmitted.

Obviously, a circuit structure where the pMOSFET 26z is in the ON state under the signal Vab=H enables transmission of a state indicating the signal Vab=H when the potential VE2 is negative.

Embodiment 5

In Embodiment 5, at least one of states of an output signal OUT is transmitted from a secondary circuit to a primary circuit while the potential VE2 is negative, using the negative potential detection circuit including the current variable circuit described in Embodiment 4. With the signal, a signal indicating at least one of states of an input signal can be generated in consideration of the state of the output signal.

Figure 9:
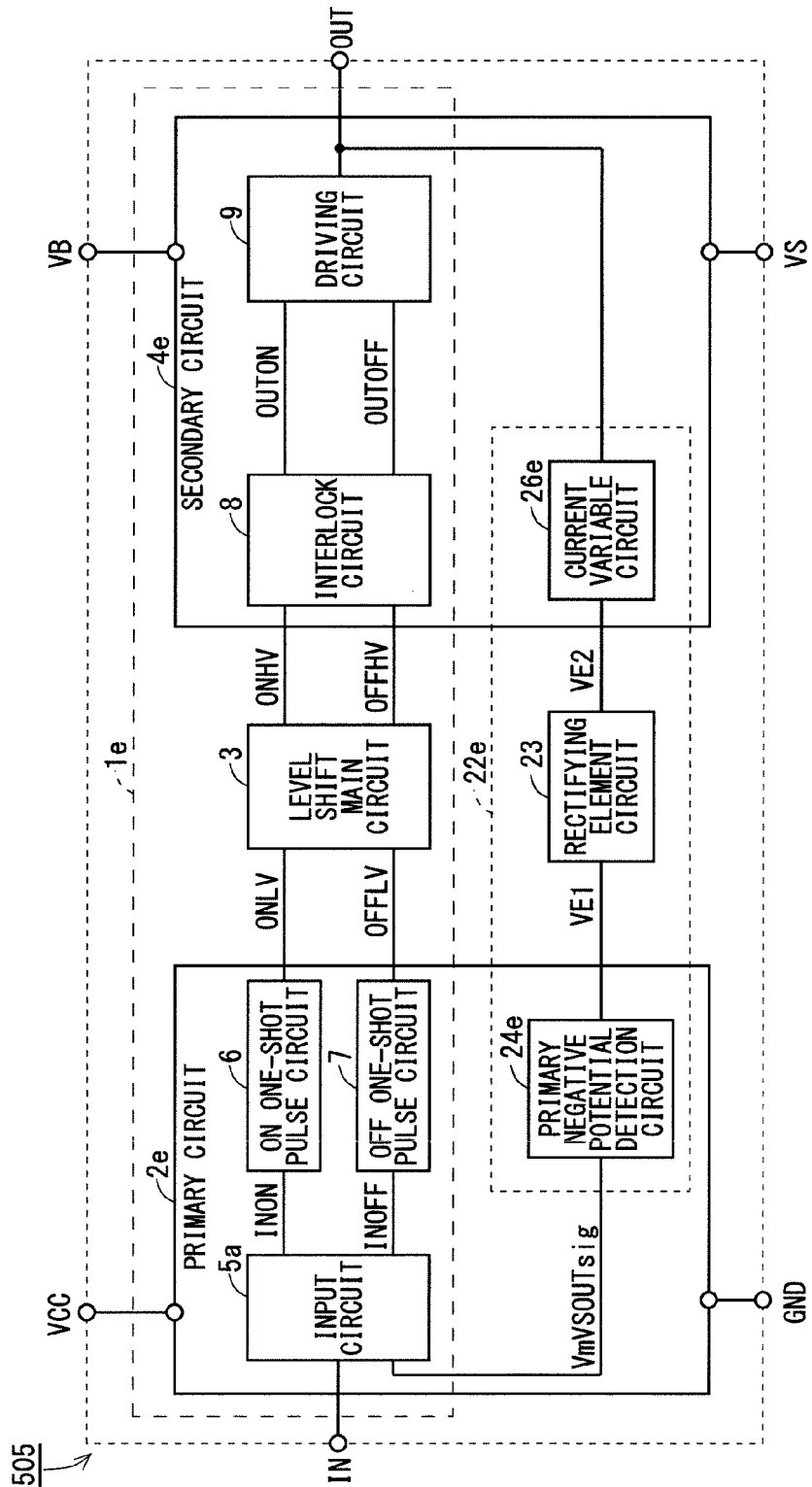
FIG. 9 is a block diagram illustrating an example of a structure of a level shift circuit according to Embodiment 5 of the present invention.

With reference to FIG. 9, a negative potential detector 22e of a level shift circuit 505 includes a primary negative potential detection circuit 24e and a current variable circuit 26e.

The current variable circuit 26e is a circuit that varies a value of the current flowing through the rectifying element circuit 23, according to a state of the output signal OUT. The primary negative potential detection circuit 24e is a circuit that detects, as a signal VmVSOUTsig, at least one of states of the output signal OUT while the potential VE2 is negative by detecting the change in value of the current. Upon input of the signal VmVSOUTsig transmitted from the secondary circuit 4e to the input circuit 5a, at least one of signals INON and INOFF can be generated also by using the signal VmVSOUTsig. The signal VmVSOUTsig is a signal to be generated when the potential VE2 is negative and the level shift main circuit 3 cannot transmit a signal, and a signal to be inverted when the potential VE2 increases and the level shift main circuit 3 can transmit a signal. At least one of the states of the input signal IN can be transmitted to the secondary circuit 4e by generating at least one of the signals INON and INOFF using the inversion of the signal VmVSOUTsig as a trigger.

The input circuit 5a may generate the signal INON using the signal VmVSOUTsig when the signal VmVSOUTsig indicates the output signal OUT=L and the input signal IN=H is satisfied. Alternatively, the input circuit 5a may generate the signal INOFF using the signal VmVSOUTsig when the signal VmVSOUTsig indicates the output signal OUT=H and the input signal IN=L is satisfied. Accordingly, when the input signal IN differs from the output signal OUT in state, at least one of the signals INON and INOFF can be generated.

According to Embodiment 5, at least one of the states of the output signal OUT is transmitted from the secondary circuit 4e to the primary circuit 2e while the potential VE2 is negative. Using the inversion of the signal as a trigger, a signal indicating at least one of the states of the input signal IN is generated. Accordingly, when the input signal IN is identical to the output signal OUT in state, that is, when a latch does not malfunction, unnecessary operations of the level shift circuit 505 can be reduced. Furthermore, in an operation where the latch malfunctions when the potential VE2 is negative, the malfunctioning period can be shortened more than that according to Embodiment 3.

Embodiment 6

In Embodiment 6, at least one of states of an input signal IN is transmitted from a primary circuit to a secondary circuit when the potential VE2 is negative, using the negative potential detection circuit including the current variable circuit described in Embodiment 4.

Figure 10:
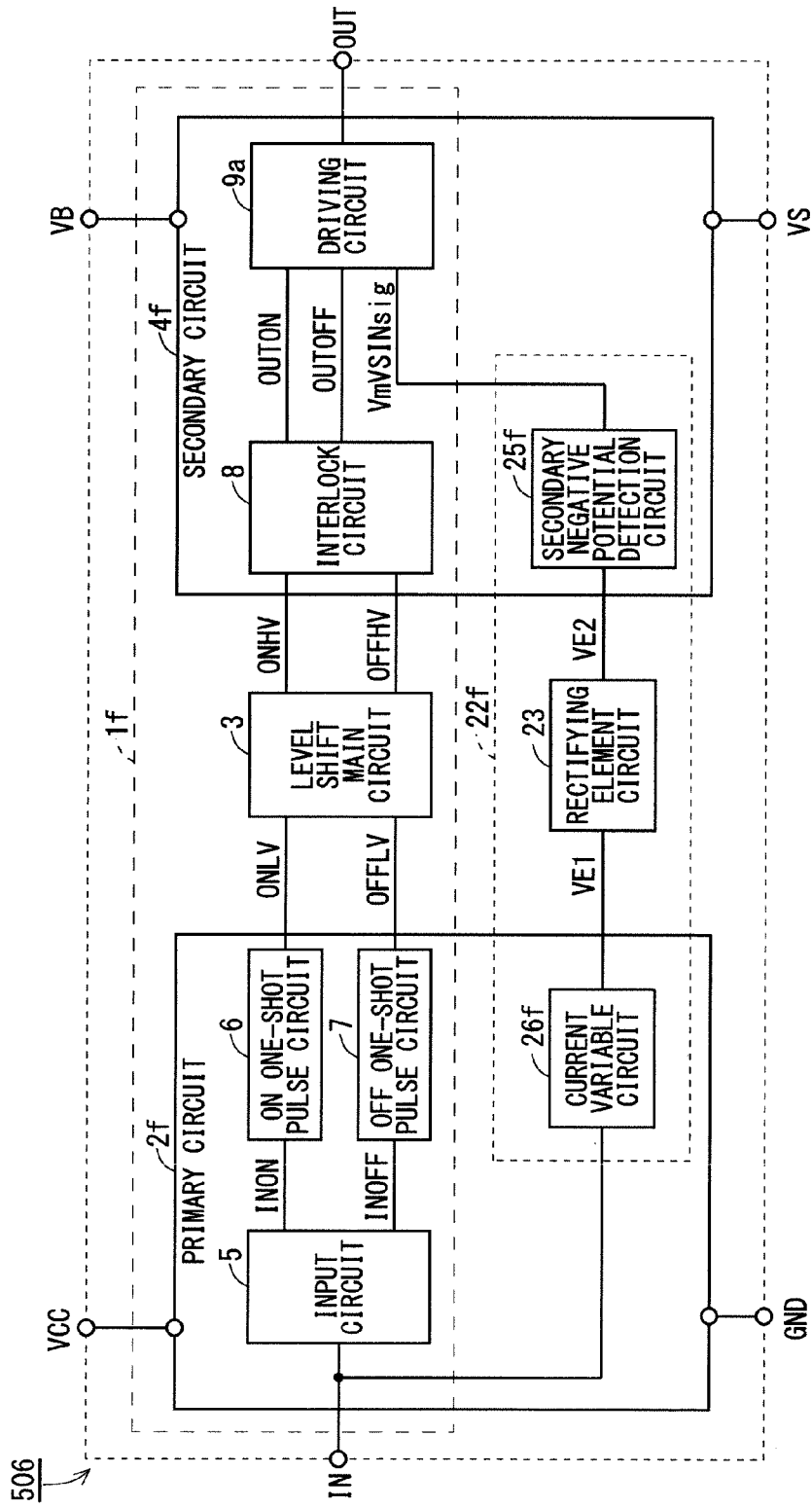
FIG. 10 is a block diagram illustrating an example of a structure of a level shift circuit according to Embodiment 6 of the present invention.

With reference to FIG. 10, a negative potential detector 22f of a level shift circuit 506 includes a current variable circuit 26f and a secondary negative potential detection circuit 25f. The current variable circuit 26f is a circuit that varies a value of the current flowing through the rectifying element circuit 23, according to a state of the input signal IN. The secondary negative potential detection circuit 25f is a circuit that detects, as a signal VmVSINsig, at least one of the states of the input signal IN while the potential VE2 is negative by detecting the change in value of the current.

A driving circuit 9a generates an output signal OUT in synchronization with the pulse signals OUTON and OUTOFF. Particularly, the driving circuit 9a according to Embodiment 6 generates at least one of states of the output signal OUT also by using at least one signal different from the pulse signals OUTON and OUTOFF. Specifically, the driving circuit 9a generates at least one of the states of the output signal OUT also by using the signal VmVSINsig. Accordingly, the signal VmVSINsig can be reflected in the output signal OUT.

The driving circuit 9a is configured so that, for example, the signal VmVSINsig is reflected in the output signal OUT when the potential VE2 is negative and the signal VmVSINsig is detected. Specifically, the driving circuit 9a is configured so that the output signal OUT=H is satisfied when the signal VmVSINsig indicates the input signal IN=H or so that the output signal OUT=L is satisfied when the signal VmVSINsig indicates the input signal IN=L. Accordingly, at least one of the states of the input signal IN can be reflected in the output signal OUT while the potential VE2 is negative.

According to Embodiment 6, even when the potential VE2 is negative and the level shift main circuit 3 cannot transmit a signal, the input signal IN can be transmitted from a primary circuit 2f to a secondary circuit 4f through the rectifying element circuit 23. Thus, it is possible to prevent a latch from malfunctioning when the potential VE2 is negative, or shorten the malfunction period.

Embodiment 7

Figure 11:
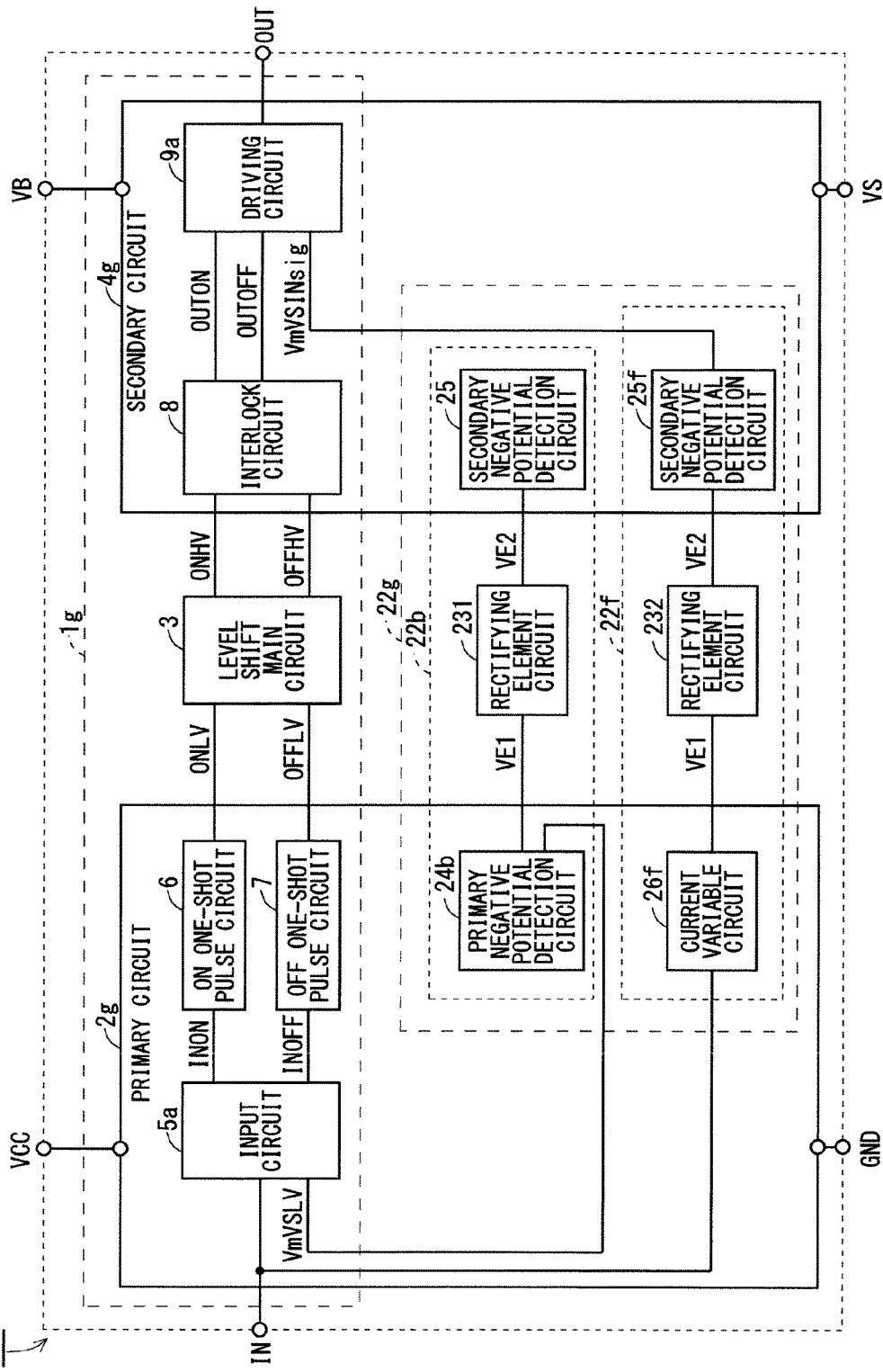
FIG. 11 is a block diagram illustrating an example of a structure of a level shift circuit according to Embodiment 7 of the present invention.

With reference to FIG. 11, a negative potential detector 22g of a level shift circuit 507 includes the negative potential detector 22b (FIG. 5, Embodiment 2) and the negative potential detector 22f (FIG. 10, Embodiment 6). Thus, a rectifying element circuit 231 (first rectifying element circuit) of the negative potential detector 22b and a rectifying element circuit 232 (second rectifying element circuit) of the negative potential detector 22f are arranged. A primary negative potential detection circuit 24b (first detection circuit) detects a change in a current flowing through the rectifying element circuit 231. A secondary negative potential detection circuit 25f (second detection circuit) detects a change in a current flowing through the rectifying element circuit 232.

The potential VE1 at one end of the rectifying element circuit 231 is not necessarily the same as that of the rectifying element circuit 232. This holds true for the potential VE2.

According to Embodiment 7, as in Embodiment 6, even when the level shift main circuit 3 cannot transmit a signal, the input signal IN is transmitted from a primary circuit 2g to a secondary circuit 4g through the rectifying element circuit 232. Furthermore, even if this transmission is impossible, a state of the input signal IN can be transmitted to the secondary circuit 4g when the problem that the level shift main circuit 3 cannot transmit a signal is resolved without waiting for switching of the input signal IN as in Embodiment 2. Thus, it is possible to more reliably prevent a latch in the level shift main circuit 3 from malfunctioning or shorten the malfunction period.

Embodiment 8

Figure 12:
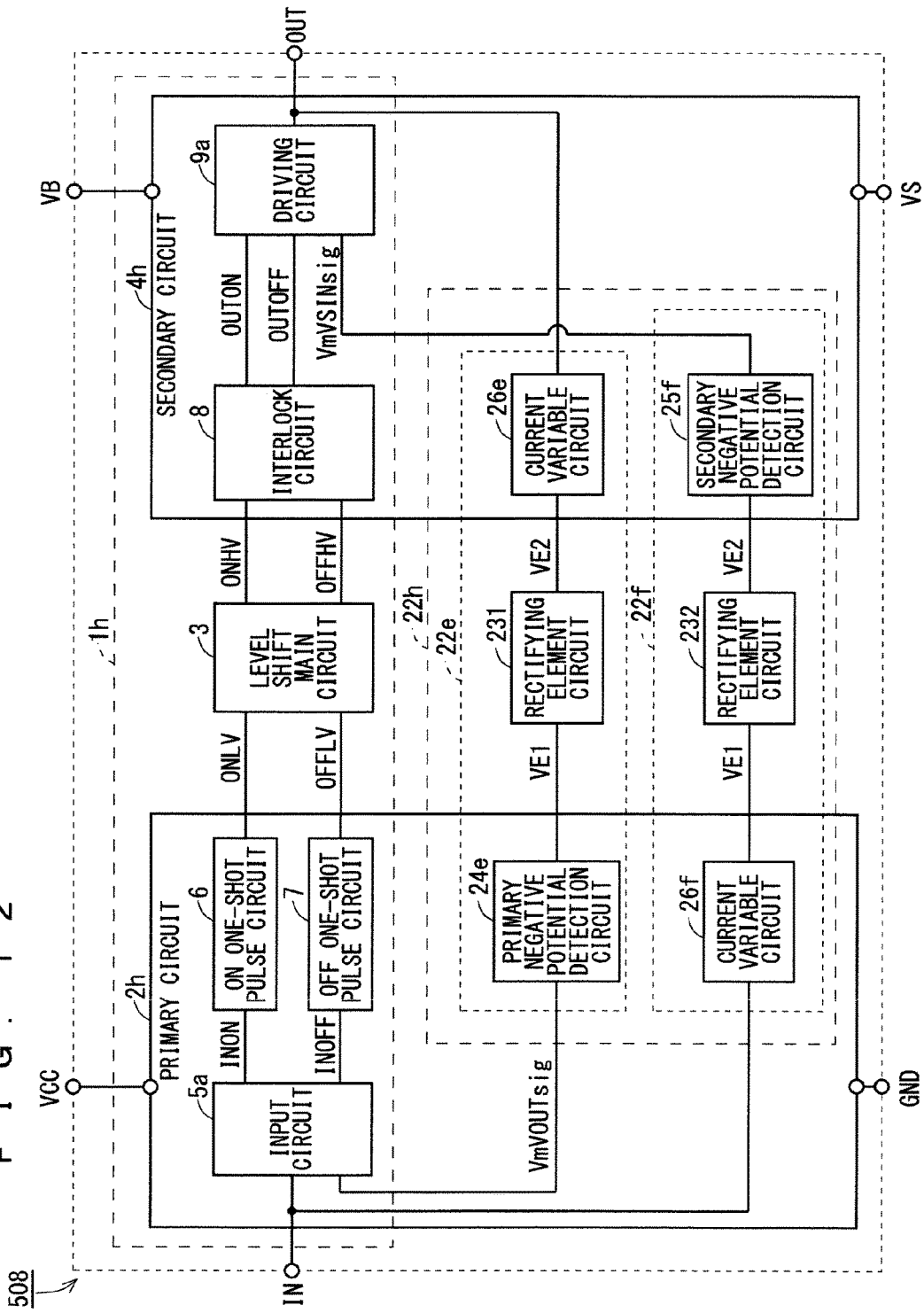
FIG. 12 is a block diagram illustrating an example of a structure of a level shift circuit according to Embodiment 8 of the present invention.

With reference to FIG. 12, a negative potential detector 22h of a level shift circuit 508 includes the negative potential detector 22e (FIG. 9, Embodiment 5) including the current variable circuit 26e (first current variable circuit), and the negative potential detector 22f (FIG. 10, Embodiment 6) including the current variable circuit 26f (second current variable circuit). Thus, a rectifying element circuit 231 (first rectifying element circuit) of the negative potential detector 22e and a rectifying element circuit 232 (second rectifying element circuit) of the negative potential detector 22f are arranged. The primary negative potential detection circuit 24e (first detection circuit) included in a primary circuit 2h detects a change in a current flowing through the rectifying element circuit 231. The secondary negative potential detection circuit 25f (second detection circuit) included in a secondary circuit 4h detects a change in a current flowing through the rectifying element circuit 232.

The potential VE1 at one end of the rectifying element circuit 231 is not necessarily the same as that of the rectifying element circuit 232. This holds true for the potential VE2.

According to Embodiment 8, the negative potential detector 22e detects a state of an output signal during a negative potential period as a signal VmVSOUTsig. Accordingly, it is possible to detect whether or not the negative potential detector 22f transmits an input signal during the negative potential period. Thus, the operation after detecting the negative potential can be controlled using the information.

For example, when the negative potential detector 22f transmits an input signal IN during a negative potential period, the input signal IN and the output signal OUT are in the same state at the end of the negative potential period. Thus, the signals INON and INOFF are not generated. When the negative potential detector 22f does not transmit an input signal during a negative potential period and the input signal IN and the output signal OUT are in different states at the end of the negative potential period, the signals INON and INOFF are generated. Accordingly, when malfunctioning of the latch cannot be resolved during the negative potential period, the input signal can be transmitted through the level shift main circuit 3. Accordingly, it is possible to prevent a latch from malfunctioning or shorten the malfunction period during the negative potential period and reduce the unnecessary operations when the malfunctioning of the latch is canceled during the negative potential period.

Embodiment 9

Figure 13:
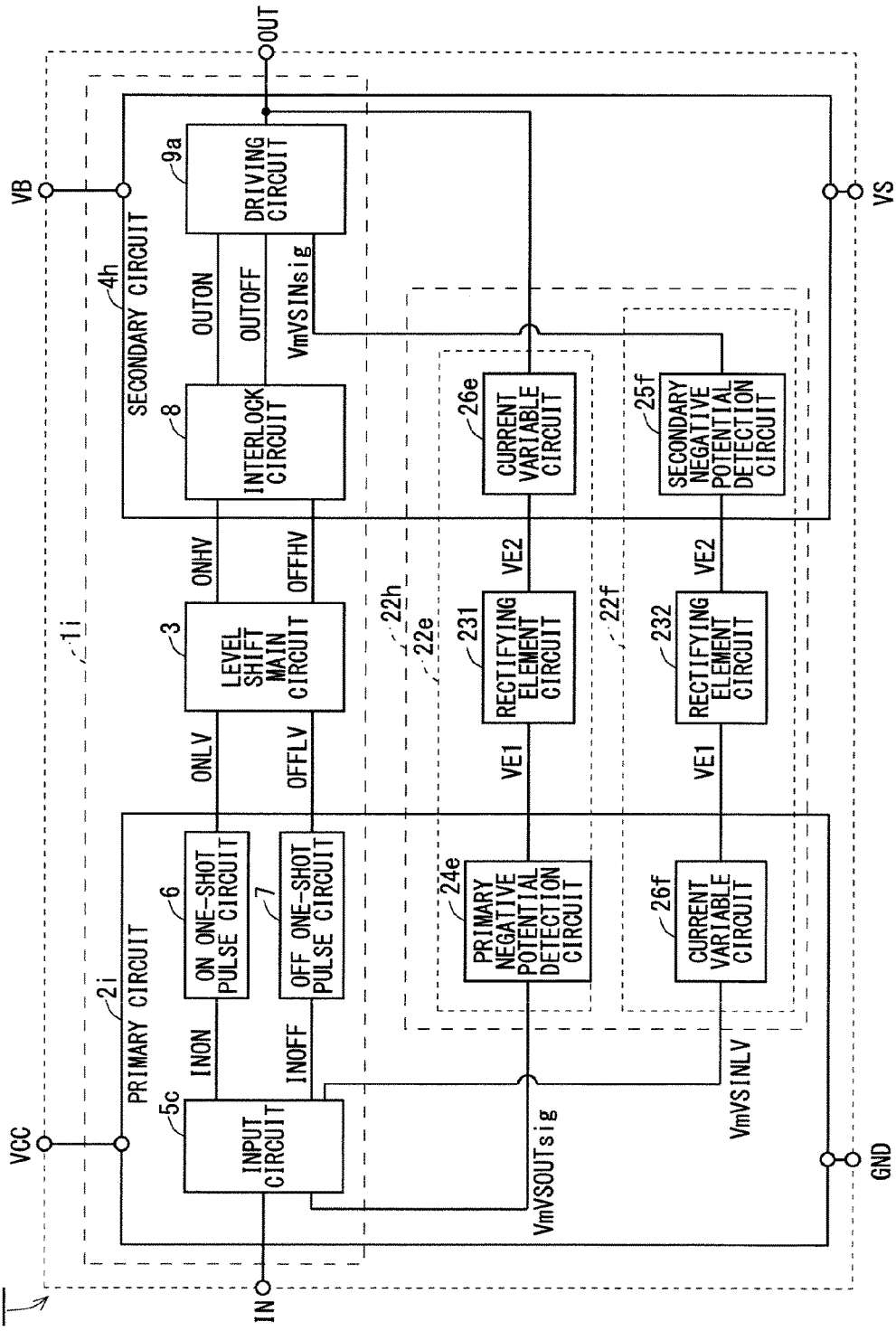
FIG. 13 is a block diagram illustrating an example of a structure of a level shift circuit according to Embodiment 9 of the present invention.

With reference to FIG. 13, a primary circuit 2i of a level shift circuit 509 includes an input circuit 5c. The input circuit 5c is a circuit that generates signals INON and INOFF in synchronization with an input signal IN, and generates the signal INON, the signal INOFF, or a signal VmVSINLV, also by using a signal VmVSOUTsig from the primary negative potential detection circuit 24e of the negative potential detector 22e.

Since the structure other than the described structure is the same as that according to Embodiment 8, the same reference numerals are attached to the same or corresponding elements and the description thereof is not repeated.

According to Embodiment 9, the negative potential detector 22e transmits a state of an output signal OUT during a negative potential period to the primary circuit 2i, so that the negative potential detector 22f can transmit the input signal IN only when the state is a negative potential state and the input signal IN differs from the output signal OUT in state. Accordingly, when a latch does not malfunction, the unnecessary operations can be reduced.

For example, only when the output signal OUT indicated by the signal VmVSOUTsig differs from the input signal IN in state, the input circuit 5c generates a signal VmVSINLV indicating the state of the input signal IN. The negative potential detector 22f transmits the signal VmVSINLV to the secondary circuit 4h, whereby it is possible to prevent a latch from malfunctioning or shorten the malfunction period while the unnecessary operations are reduced.

Furthermore, the negative potential detector 22e can detect the presence or absence of the transmission of a signal by the negative potential detector 22f as according to Embodiment 8. Accordingly, when the malfunctioning of the latch cannot be resolved during the negative potential period, the input signal can be transmitted through the level shift main circuit 3.

Embodiment 10

According to Embodiment 10, the driving circuit 9a (FIGS. 10 to 13, Embodiments 6 to 9) assigns a priority to a signal to be reflected in an output signal OUT. When the potential VE2 is lower than or equal to the potential VE1 and the level shift main circuit 3 can transmit a signal, that is, when the potential of the power supply voltage VB is higher than the reference potential GND in the level shift main circuit 3, there are cases where signals OUTON and OUTOFF transmitted through the level shift main circuit 3 are input to the driving circuit 9a simultaneously with a signal transmitted through the rectifying element circuit 23, 231, or 232. Here, when the signals OUTON and OUTOFF transmitted through the level shift main circuit 3 differ in state from the signal transmitted through the rectifying element circuit 23, 231, or 232, the driving circuit 9a may malfunction.

In Embodiment 10, the malfunctioning of the driving circuit 9a can be prevented by preferentially reflecting, in the output signal OUT, the signals OUTON and OUTOFF transmitted through the level shift main circuit 3. Specifically, only when the pulse signals OUTON and OUTOFF are not input to the driving circuit 9a, the signal VmVSINsig is reflected in the output signal OUT. Accordingly, when an input signal transmitted through the level shift main circuit 3 is input simultaneously with an input signal transmitted through the negative potential detector 22f, the signal transmitted through the level shift main circuit 3 can be preferentially reflected in the output signal OUT.

According to Embodiment 10, a signal can be transmitted when the potential VE2 is negative, and the malfunctioning of the signal transmission can be prevented.

Embodiment 11

Figure 14:
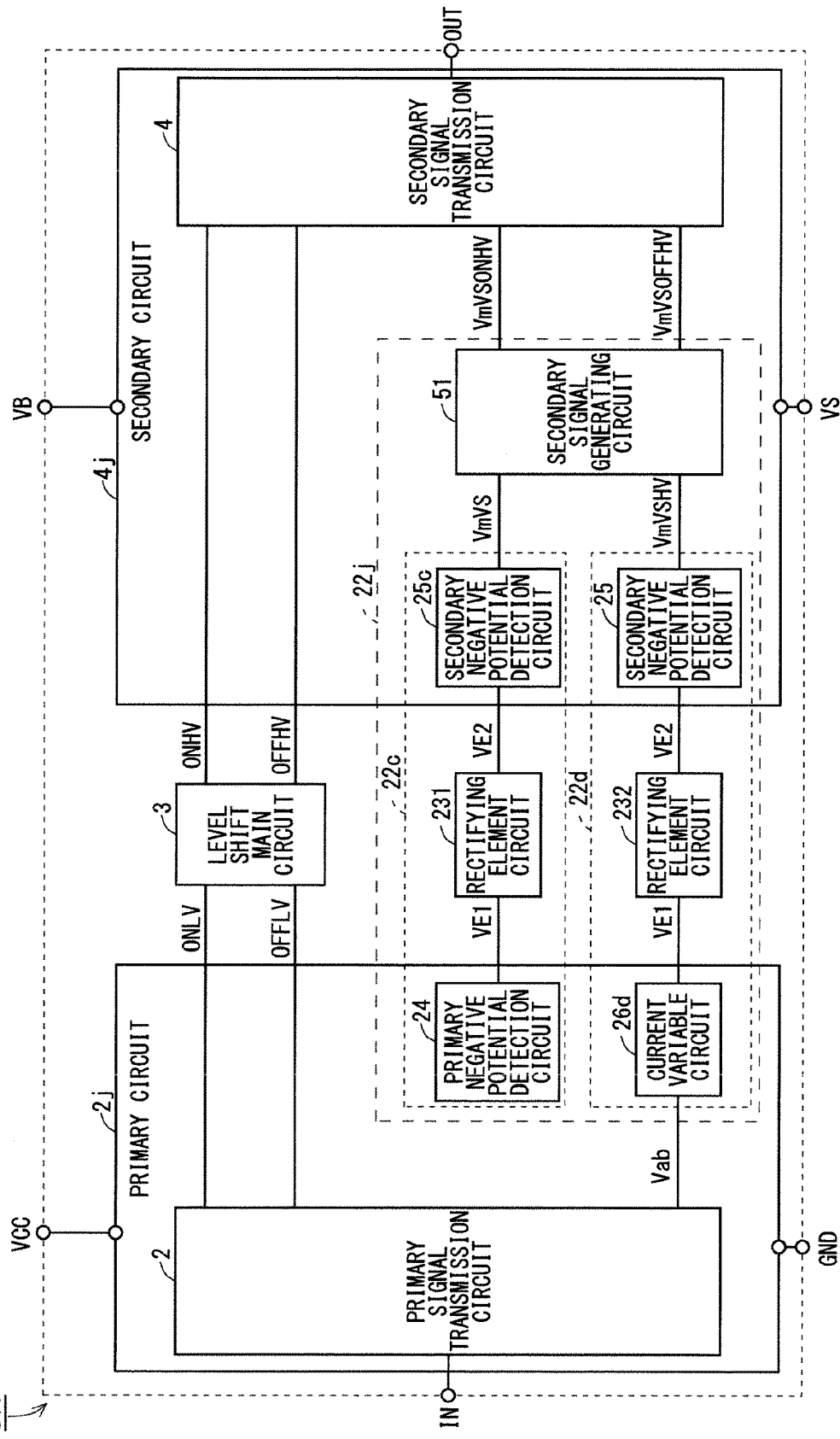
FIG. 14 is a block diagram illustrating an example of a structure of a level shift circuit according to Embodiment 11 of the present invention.

With reference to FIG. 14, a negative potential detector 22j of a level shift circuit 511 includes a negative potential detector 22c and a secondary signal generating circuit 51, in addition to the structure of the negative potential detector 22d of the level shift circuit 504 (FIG. 7, Embodiment 4). The secondary signal generating circuit 51 according to Embodiment 11 is included in a secondary circuit 4j.

The negative potential detector 22j is a circuit that transmits a signal indicating any signal Vab from a primary circuit 2j to the secondary circuit 4j when each of the potentials VE2 of the negative potential detectors 22c and 22d is negative. The signal Vab is in one of the H state and the L state (first and second states). A secondary negative potential detection circuit 25 of the negative potential detector 22d is a circuit that generates a signal (one signal) indicating one of the H state and the L state. The secondary signal generating circuit 51 is a circuit that generates, by using this signal, signals VmVSONHV and VmVSOFFHV indicating the H state and the L state, respectively. The secondary signal generating circuit 51 generates the signals VmVSONHV and VmVSOFFHV when not only the potential VE2 of the negative potential detector 22d but also the potential VE2 of the negative potential detector 22c are negative. For this purpose, the secondary signal generating circuit 51 refers to a detection signal VmVS of the secondary negative potential detection circuit 25c in the negative potential detector 22c.

The signal VmVSHV is, for example, a signal indicating the signal Vab=H. Here, the signal VmVSONHV is generated in synchronization with the signal VmVSHV, and the signal VmVSOFFHV is generated in synchronization with a signal obtained by inverting the signal VmVSHV. Accordingly, in the case where each of the potentials VE2 of the negative potential detectors 22c and 22d is negative, the signal VmVSONHV is generated when the signal Vab=H is satisfied and the VmVSOFFHV signal is generated when the signal Vab=L is satisfied.

According to Embodiment 11, when the reference potential VS of the secondary circuit 4j is negative and the level shift main circuit 3 cannot transmit a signal, information on the signal Vab that is in one of the two states (H or L) can be transmitted between the primary circuit 2j and the secondary circuit 4j through the rectifying element circuit 232.

Although a case where the signal Vab is transmitted from the primary circuit 2j to the secondary circuit 4j is described in detail, the signal can be transmitted from the secondary circuit 4j to the primary circuit 2j as according to Embodiment 4.

Embodiment 12

Figure 15:
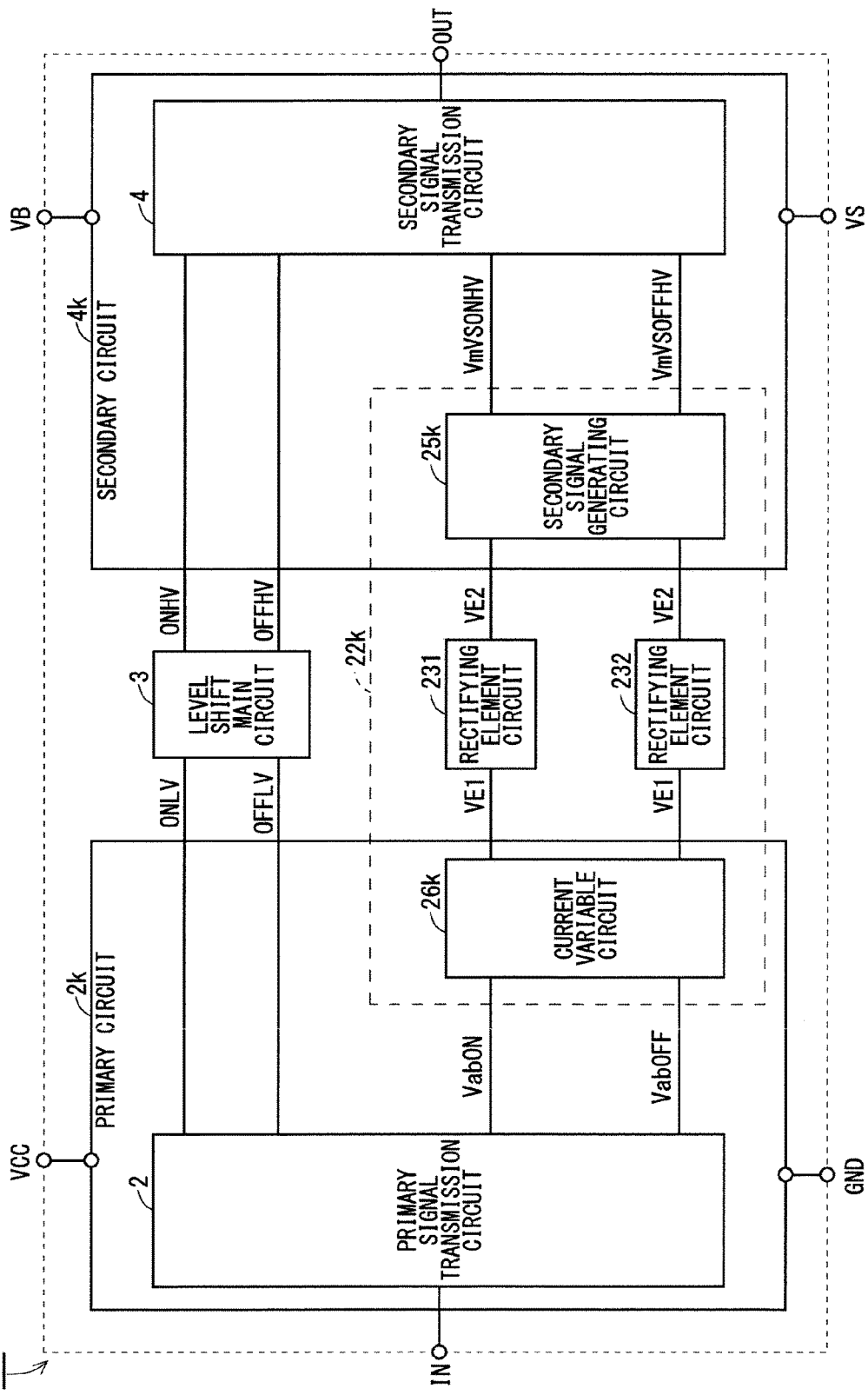
FIG. 15 is a block diagram illustrating an example of a structure of a level shift circuit according to Embodiment 12 of the present invention.

With reference to FIG. 15, a level shift circuit 512 includes a negative potential detector 22k instead of the negative potential detector 22d in the level shift circuit 504 (FIG. 7, Embodiment 4). The negative potential detector 22k includes a current variable circuit 26k, rectifying element circuits 231 (first rectifying element circuit) and 232 (second rectifying element circuit), and a secondary negative potential detection circuit 25k.

The rectifying element circuits 231 and 232 are provided between the current variable circuit 26k and the secondary negative potential detection circuit 25k. The current variable circuit 26k receives, from the primary signal transmission circuit 2, signals VabON and VabOFF indicating an H state (first state) and an L state (second state) of any signal, respectively. Then, currents flowing through the rectifying element circuits 231 and 232 are varied according to the signals VabON and VabOFF, respectively. The secondary negative potential detection circuit 25k detects the currents flowing through the rectifying element circuits 231 and 232 to output signals VmVSONHV and VmVSOFFHV, respectively, to the secondary signal transmission circuit 4.

With such a structure, the negative potential detector 22k has respective paths for transmitting the H and L states of any signal. Specifically, the current flows through the rectifying element circuit 231 when the potential VE2 of the rectifying element circuit 231 is negative and the signal is in the H state, whereas the current flows through the rectifying element circuit 232 when the potential VE2 of the rectifying element circuit 232 is negative and the signal is in the L state. With detection of these currents, the H state and the L state of the signal are separately transmitted to a secondary circuit 4k.

According to Embodiment 12, when the reference potential VS of the secondary circuit 4k is negative and the level shift main circuit 3 cannot transmit a signal, any signal can be transmitted from the primary circuit 2k to the secondary circuit 4k through the rectifying element circuits 231 and 232.

Furthermore, the negative potential detector 22k of Embodiment 12 may replace the negative potential detector 22d of the level shift circuit 511 in Embodiment 11 that is previously described. Accordingly, the number of the paths for transmitting information on the signal becomes two. Thus, even when a malfunction occurs in one of the paths, the signal can be transmitted through the other one of the paths. Furthermore, the signal transmitted through the other path can complement the signal that should have been transmitted through the one path.

Although a case where information on the signal is transmitted from the primary circuit 2k to the secondary circuit 4k is described in detail, the signal can be transmitted from the secondary circuit 4k to the primary circuit 2k as according to Embodiment 4 or 11.

Embodiment 13

With reference to FIG. 2 again, the HVIC 600 (integrated circuit) according to Embodiment 13 includes a level shift circuit 500 and another circuit 400 connected to the level shift circuit 500 by wiring. Specifically, the level shift circuit 500 is any one of the level shift circuits 501 to 509, 511, and 512 according to Embodiments previously described. The other circuit 400 may include a protection circuit for ensuring reliability. Furthermore, the other circuit 400 may include a circuit with functions similar to those of the LVIC 700 (FIG. 1).

The wiring between the level shift circuit 500 and the other circuit 400 can be shortened according to Embodiment 13. Accordingly, the inductance of the wiring can be reduced. Thus, occurrence of the negative surge can be reduced.

Furthermore, the level shift circuit 500 and the protection circuit included in the other circuit 400 may be ganged together in the HVIC 600. Accordingly, the reliability of the integrated circuit can be increased.

Embodiment 14

With reference to FIG. 1 again, the inverter device 900 (power semiconductor module) according to Embodiment 14 includes the HVIC 600 (integrated circuit) according to Embodiment 13, the LVIC 700, the high-potential-side switching element 102 (semiconductor switching element), and the low-potential-side switching element 103. The high-potential-side switching element 102 is driven by the HVIC 600, and the low-potential-side switching element 103 is driven by the LVIC 700.

The wiring between the high-potential-side switching element 102 and the HVIC 600 can be shortened because the high-potential-side switching element 102 and the HVIC 600 are integrated according to Embodiment 14. Consequently, the inductance of the wiring can be reduced. Thus, occurrence of the negative surge can be reduced.

The power semiconductor module may be, but not limited to, the one including an integrated circuit including the level shift circuit described according to Embodiments above, and a semiconductor switching element driven by the integrated circuit.

Embodiment 15

At least a part of the high-potential-side switching element 102 (FIG. 1) and the low-potential-side switching element 103 (FIG. 1) is a silicon carbide (SiC) semiconductor element according to Embodiment 15. When the high-potential-side switching element 102 includes an IGBT and a free-wheeling diode, at least one of the IGBT and the free-wheeling diode is a silicon carbide (SiC) semiconductor element, and preferably, at least an element having a switching function (IGBT in the examples above) is an SiC semiconductor element.

A device including a SiC semiconductor element is frequently operated under conditions in which the variation dV/dt per unit time of the reference potential VS is abrupt. Accordingly, the negative surge tends to increase, and the period of the negative surge tends to be prolonged. Thus, the advantage of reducing the negative surge described in Embodiment 14 becomes larger. Furthermore, since the negative surge prolongs a period during which the level shift main circuit 3 cannot transmit a signal in a normal operation, the effectiveness of providing a level shift circuit that can transmit a signal even during the negative surge becomes larger.

A structure in which signals with positive and negative signs that are opposite to those of the signals treated in the structures of Embodiments above may be used instead. Here, the description in which the "positive" and the "negative" in Embodiments above are replaced with each other almost holds true.

Within the scope of the present invention, Embodiments can be freely combined, and each of Embodiments can be appropriately modified or omitted. Although the present invention is described in detail, the foregoing description is in all aspects illustrative and not restrictive of the invention. It is therefore understood that numerous modifications and variations can be devised without departing from the scope of the invention.

DESCRIPTION OF REFERENCE NUMERALS 2 primary signal transmission circuit, 2a to 2k primary circuit, 3 level shift main circuit, 4 secondary signal transmission circuit, 4a to 4h, 4j, 4k secondary circuit, 5, 5a to 5c input circuit, 6 ON one-shot pulse circuit, 7 OFF one-shot pulse circuit, 8 interlock circuit, 9, 9a driving circuit, 11, 12 high withstand voltage nMOSFET, 13, 14, 31, 33 resistor, 15, 16, 34 inverter, 22, 22b to 22h, 22j, 22k, 22y, 22z negative potential detector, 23, 231, 232 rectifying element circuit, 23z high withstand voltage diode, 24, 24b, 24e primary negative potential detection circuit, 25, 25c, 25f, 25k, 25z secondary negative potential detection circuit, 26d, 26e, 26f, 26k current variable circuit, 26z pMOSFET, 32 nMOSFET, 41 inverse level shift main circuit, 42 inverse level shift driving circuit, 51 secondary signal generating circuit, 102 high-potential-side switching element (semiconductor switching element), 103 low-potential-side switching element, 500 to 508, 511, 512, 590 level shift circuit, 600 HVIC (integrated circuit), 700 LVIC, 800 driving module, 900 inverter device (power semiconductor module).

The invention claimed is:

1. A level shift circuit, comprising:
   a primary circuit that outputs, in response to a received input signal, a first signal with a first reference potential;
   a level shift main circuit that converts a reference potential of said first signal received from said primary circuit, from said first reference potential to a second reference potential to output a second signal with said second reference potential;
   a secondary circuit that generates, in response to said input signal, an output signal with said second reference potential by using said second signal received from said level shift main circuit; and
   at least one rectifying element circuit provided between said primary circuit and said secondary circuit, at least one of said primary circuit and said secondary circuit including at least one detection circuit that detects a change in a current flowing through said rectifying element circuit to determine whether a potential corresponding to said second reference potential is lower than or equal to a potential corresponding to said first reference potential.

2. The level shift circuit according to claim 1,
   wherein said at least one detection circuit generates a detection signal indicating whether said potential corresponding to said second reference potential is lower than or equal to said potential corresponding to said first reference potential, and
   said primary circuit generates a plurality of signals corresponding to a plurality of possible states of said input signal, at least one of said plurality of signals being generated also by using said detection signal.

3. The level shift circuit according to claim 1,
   wherein said at least one detection circuit generates a detection signal indicating whether said potential corresponding to said second reference potential is lower than or equal to said potential corresponding to said first reference potential,
   said level shift circuit further comprises an inverse level shift main circuit that transmits a signal indicating at least one of states of said output signal, to said primary circuit by using said detection signal, and
   said primary circuit generates a signal indicating at least one of states of said input signal also by using said signal transmitted from said inverse level shift main circuit.

4. The level shift circuit according to claim 1,
   wherein one of said primary circuit and said secondary circuit includes said at least one detection circuit, and the other of said primary circuit and said secondary circuit includes a current variable circuit that makes a value of said current flowing through said rectifying element circuit variable according to any signal.

5. The level shift circuit according to claim 4,
   wherein said current variable circuit is included in said secondary circuit, and said any signal in said current variable circuit is a signal indicating at least one of states of said output signal, and
   said primary circuit generates a signal indicating at least one of states of said input signal, also by using said signal generated by said at least one detection circuit.

6. The level shift circuit according to claim 4,
   wherein said current variable circuit is included in said primary circuit, and said any signal in said current variable circuit is a signal indicating at least one of states of said input signal.

7. The level shift circuit according to claim 1,
   wherein said at least one rectifying element circuit includes a first rectifying element circuit and a second rectifying element circuit,
   said at least one detection circuit includes a first detection circuit that detects a change in a current flowing through said first rectifying element circuit, and a second detection circuit that detects a change in a current flowing through said second rectifying element circuit,
   said first detection circuit generates a detection signal indicating whether said potential corresponding to said second reference potential is lower than or equal to said potential corresponding to said first reference potential,
   said primary circuit generates a plurality of signals corresponding to a plurality of possible states of said input signal, at least one of said plurality of signals being generated also by using said detection signal, and
   said primary circuit includes a current variable circuit that makes a value of said current flowing through said second rectifying element circuit variable according to a signal indicating at least one of states of said input signal.

8. The level shift circuit according to claim 1,
   wherein said at least one rectifying element circuit includes a first rectifying element circuit and a second rectifying element circuit,
   said at least one detection circuit includes a first detection circuit that detects a change in a current flowing through said first rectifying element circuit, and a second detection circuit that detects a change in a current flowing through said second rectifying element circuit,
   said secondary circuit includes a first current variable circuit that makes a value of said current flowing through said first rectifying element circuit variable according to a signal indicating at least one of states of said output signal,
   said primary circuit generates a signal indicating at least one of states of said input signal also by using a signal generated by said first detection circuit, and
   said primary circuit includes a second current variable circuit that makes a value of said current flowing through said second rectifying element circuit variable according to said signal indicating at least one of states of said input signal.

9. The level shift circuit according to claim 1,
   wherein said at least one rectifying element circuit includes a first rectifying element circuit and a second rectifying element circuit,
   said at least one detection circuit includes a first detection circuit that detects a change in a current flowing through said first rectifying element circuit, and a second detection circuit that detects a change in a current flowing through said second rectifying element circuit, said secondary circuit includes a first current variable circuit that makes a value of said current flowing through said first rectifying element circuit variable according to a signal indicating at least one of states of said output signal, said primary circuit includes an input circuit that generates a signal indicating at least one of states of said input signal also by using a signal generated by said first detection circuit, and said primary circuit includes a second current variable circuit that makes a value of said current flowing through said second rectifying element circuit variable according to said signal generated by said input circuit.

10. The level shift circuit according to claim 6,
wherein said secondary circuit includes a driving circuit that generates said output signal on the basis of one of a signal transmitted through said level shift main circuit and a signal transmitted through said rectifying element circuit, and said driving circuit generates said output signal on the basis of said signal transmitted through said level shift main circuit, when receiving both of said signal transmitted through said level shift main circuit and said signal transmitted through said rectifying element circuit.

11. The level shift circuit according to claim 1,
wherein one of said primary circuit and said secondary circuit includes said at least one detection circuit and a signal generating circuit, and the other of said primary circuit and said secondary circuit includes a current variable circuit that makes a value of a current flowing through said rectifying element circuit variable according to a first state of any signal, said any signal being in one of said first state and a second state different from said first state, said at least one detection circuit generates one signal indicating said first state of said any signal, and said signal generating circuit generates, by using said one signal, respective signals indicating said first state and said second state.

12. The level shift circuit according to claim 1,
wherein said at least one rectifying element circuit includes a first rectifying element circuit and a second rectifying element circuit, one of said primary circuit and said secondary circuit includes a current variable circuit that makes a value of a current flowing through said first rectifying element circuit variable according to a signal indicating a first state of any signal, and makes a value of a current flowing through said second rectifying element circuit variable according to a signal indicating a second state of said any signal, said any signal being in one of said first state and said second state, and the other of said primary circuit and said secondary circuit includes said at least one detection circuit that detects changes in said currents flowing through said first rectifying element circuit and said second rectifying element circuit to generate respective signals indicating said first state and said second state of said any signal.

13. An integrated circuit, comprising
said level shift circuit according to claim 1, and another circuit connected to said level shift circuit by wiring.

14. A power semiconductor module, comprising
said integrated circuit according to claim 13, and a semiconductor switching element driven by said integrated circuit.

15. The power semiconductor module according to claim 14, wherein said semiconductor switching element includes a silicon carbide semiconductor element.

16. The level shift circuit according to claim 7,
wherein said secondary circuit includes a driving circuit that generates said output signal on the basis of one of a signal transmitted through said level shift main circuit and a signal transmitted through said rectifying element circuit, and said driving circuit generates said output signal on the basis of said signal transmitted through said level shift main circuit, when receiving both of said signal transmitted through said level shift main circuit and said signal transmitted through said rectifying element circuit.

17. The level shift circuit according to claim 8,
wherein said secondary circuit includes a driving circuit that generates said output signal on the basis of one of a signal transmitted through said level shift main circuit and a signal transmitted through said rectifying element circuit, and said driving circuit generates said output signal on the basis of said signal transmitted through said level shift main circuit, when receiving both of said signal transmitted through said level shift main circuit and said signal transmitted through said rectifying element circuit.

18. The level shift circuit according to claim 9,
wherein said secondary circuit includes a driving circuit that generates said output signal on the basis of one of a signal transmitted through said level shift main circuit and a signal transmitted through said rectifying element circuit, and said driving circuit generates said output signal on the basis of said signal transmitted through said level shift main circuit, when receiving both of said signal transmitted through said level shift main circuit and said signal transmitted through said rectifying element circuit.

* * * * *